(12) United States Patent
Dutton et al.

(10) Patent No.: US 11,402,263 B2
(45) Date of Patent: Aug. 2, 2022

(54) OPTICAL SENSOR AND METHOD OF OPERATING AN OPTICAL SENSOR

(71) Applicant: STMicroelectronics (Research & Development) Limited, Marlow (GB)

(72) Inventors: Neale Dutton, Edinburgh (GB); John Kevin Moore, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 477 days.

(21) Appl. No.: 16/448,121

(22) Filed: Jun. 21, 2019

(65) Prior Publication Data
US 2020/0011732 A1 Jan. 9, 2020

(30) Foreign Application Priority Data
Jul. 5, 2018 (EP) ..................................... 18182022

(51) Int. Cl.
| | | |
|---|---|---|
| *G01J 1/44* | (2006.01) | |
| *G01J 1/02* | (2006.01) | |
| *G01J 1/04* | (2006.01) | |
| *H01L 31/02* | (2006.01) | |

(52) U.S. Cl.
CPC .............. *G01J 1/44* (2013.01); *G01J 1/0271* (2013.01); *G01J 1/0459* (2013.01); *H01L 31/02016* (2013.01); *G01J 2001/446* (2013.01); *G01J 2001/4413* (2013.01)

(58) Field of Classification Search
CPC .......... G01J 1/44; G01J 1/0271; G01J 1/0459; G01J 2001/4413; G01J 2001/446; G01J 2001/442; G01J 2001/4466; H01L 31/02016; H01L 31/02027
See application file for complete search history.

(56) References Cited

U.S. PATENT DOCUMENTS

| | | | |
|---|---|---|---|
| 2016/0223397 A1* | 8/2016 | Tsai | G01J 1/44 |
| 2016/0284743 A1* | 9/2016 | Mellot | H01L 27/1443 |
| 2017/0179173 A1* | 6/2017 | Mandai | H01L 27/14643 |
| 2018/0180470 A1* | 6/2018 | Seitz | G01S 7/4868 |
| 2018/0180473 A1* | 6/2018 | Clemens | G01S 7/497 |
| 2020/0011732 A1 | 1/2020 | Dutton et al. | |

FOREIGN PATENT DOCUMENTS

| | | | | |
|---|---|---|---|---|
| CN | 106898675 A | 6/2017 | | |
| CN | 210123310 U | 3/2020 | | |
| DE | 102014207599 A1 * | 10/2015 | ............ | G01J 1/4228 |
| EP | 3182154 A1 | 6/2017 | | |
| WO | 2017209206 A1 | 12/2017 | | |

\* cited by examiner

*Primary Examiner* — Thanh Luu
*Assistant Examiner* — Monica T Taba
(74) *Attorney, Agent, or Firm* — Slater Matsil, LLP

(57) ABSTRACT

An optical sensor includes at least one photodetector configured to be reverse biased at a voltage exceeding a breakdown voltage by an excess bias voltage. At least one control unit is configured to adjust the reverse bias of the at least one photodetector. A method of operating an optical sensor is also disclosed.

25 Claims, 25 Drawing Sheets

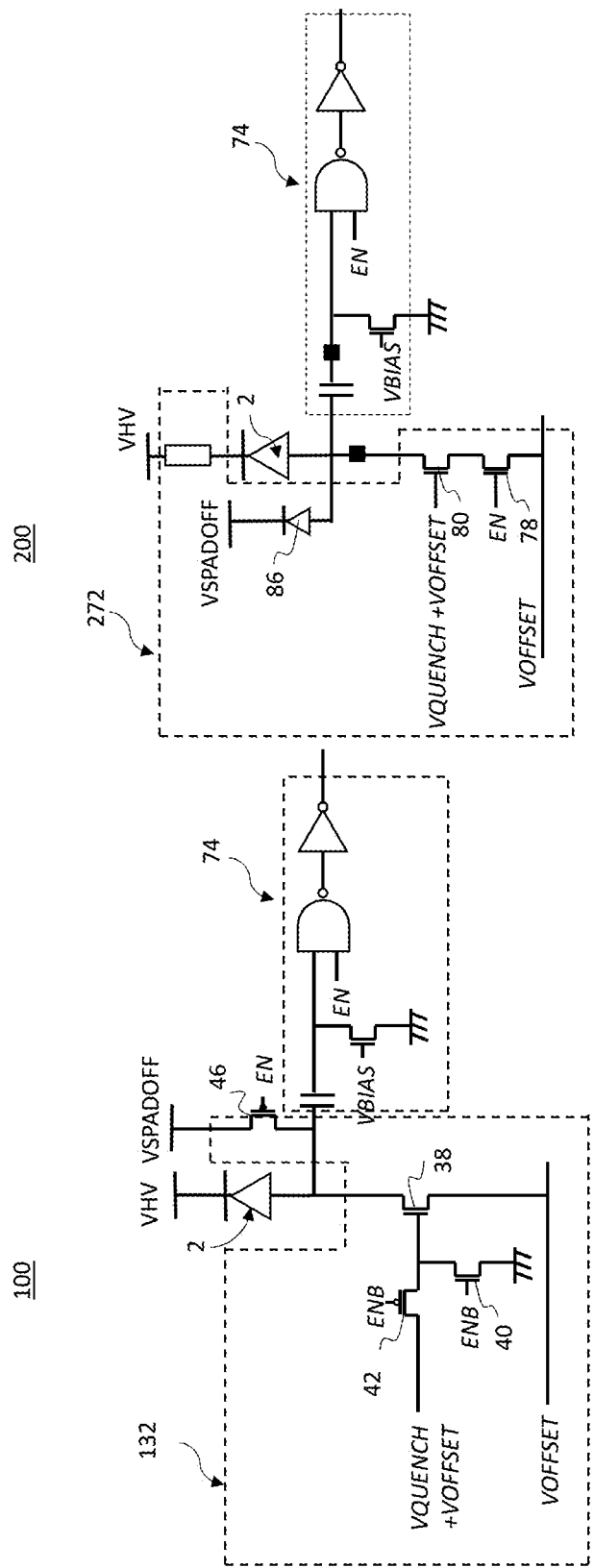

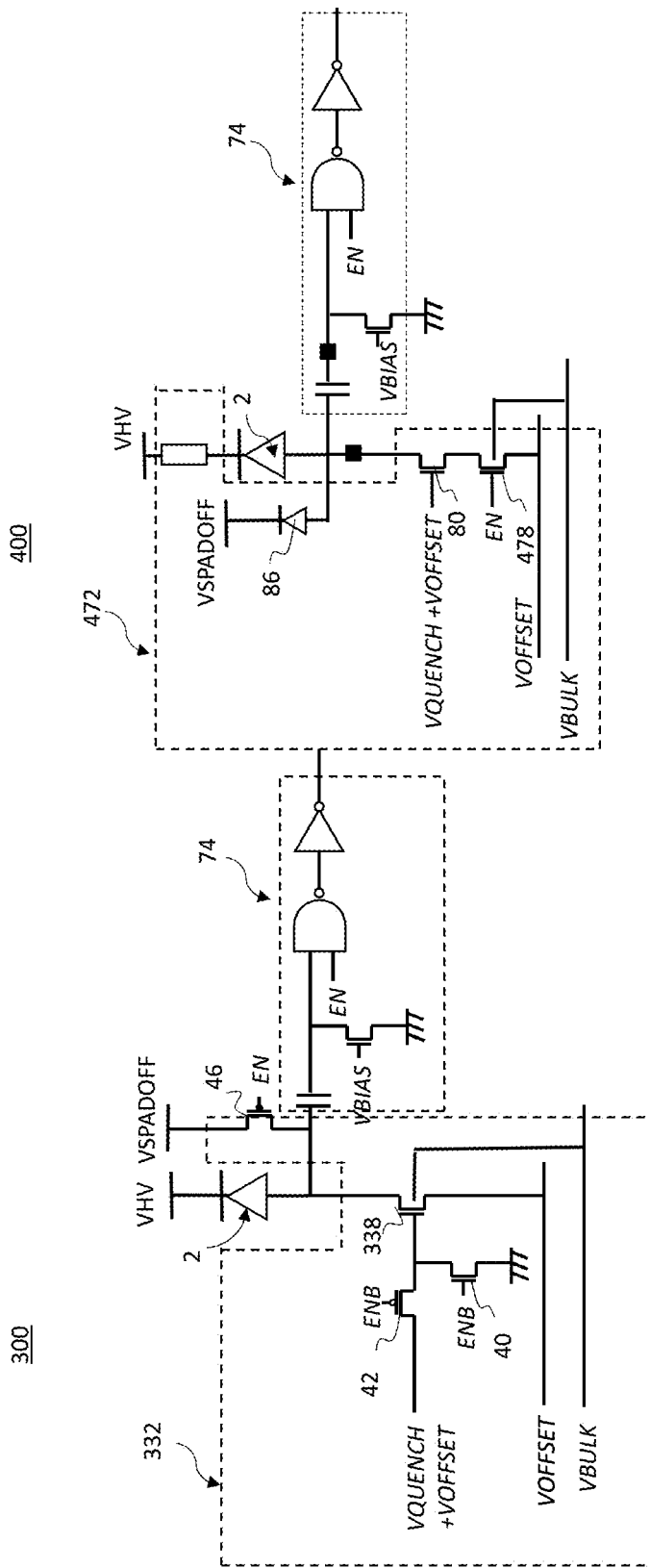

Two types of avalanche diodes

| B | A |
|---|---|
| A | B |

Fig. 14

Three types of avalanche diodes

| B | A |
|---|---|
| A | C |

Fig. 18

OPTICAL SENSOR AND METHOD OF OPERATING AN OPTICAL SENSOR

CROSS-REFERENCE TO RELATED APPLICATIONS

This application claims priority to European Patent Application No. 18182022.6, filed on Jul. 5, 2018, which application is hereby incorporated herein by reference.

TECHNICAL FIELD

The present disclosure relates to an optical sensor and a method of operating an optical sensor.

BACKGROUND

Existing single photon avalanche diodes (SPADs) are based on a PN junction. The PN junction is reverse biased at a voltage exceeding a breakdown voltage by an excess bias voltage. In this way, a carrier generated by a single photon can be injected into a depletion region and can cause a self-sustaining avalanche. The SPAD may be quenched allowing the PN junction to be reset to detect further photons.

SUMMARY

According to one aspect, an optical sensor comprises at least one photodetector configured to be reverse biased at a voltage exceeding a breakdown voltage by an excess bias voltage. At least one control unit is configured to adjust the reverse bias of the at least one photodetector.

The optical sensor may be a proximity sensor.

The overall dynamic range of the optical sensor may be electrically controlled (i.e., by adjusting the excess bias voltage of the at least one photodetector) as opposed to optically controlled (i.e., by adjusting the aperture of the at least one photodetector).

The at least one control unit may be configured to adjust a voltage of an anode of the at least one photodetector.

Because the at least one photodetector is configured to be reverse biased, the voltage of the anode of the at least one photodetector is lower than the voltage of the cathode of the at least photodetector. In such circumstances, adjusting the voltage of the anode as opposed to the voltage of the cathode may be preferable because a power unit may have to handle less power and therefore may require less space to be fitted.

The optical sensor may comprise at least a first photodetector configured to be reverse biased at a voltage exceeding a breakdown voltage by a first excess bias voltage; at least a second photodetector configured to be reverse biased at a voltage exceeding a breakdown voltage by a second excess bias voltage different from the first excess bias voltage; at least a first control unit configured to adjust the first excess bias voltage; and at least a second control unit configured to adjust the second excess bias voltage.

The optical sensor may comprise at least a third photodetector configured to be reverse biased at a voltage exceeding a breakdown voltage by a third excess bias voltage different from the first excess bias voltage and the second excess bias, and at least a third control unit configured to adjust the third excess bias voltage.

The second excess bias voltage may be lower than the first excess bias voltage and/or the third excess bias voltage is lower than the second excess bias voltage.

The first excess bias voltage may be fixed over a shot cycle of a photoemitter.

The second excess bias voltage and/or the third excess bias voltage may be varied over a shot cycle of a photoemitter.

The second excess bias voltage and/or the third excess bias voltage may be increased over a shot cycle of a photoemitter.

The second excess bias voltage and the third excess bias voltage may be increased during different portions of a shot cycle of a photoemitter.

The third excess bias voltage may be increased during a portion of shot cycle of a photoemitter and the second excess bias voltage is increased during a subsequent portion of the shot cycle of the photoemitter.

The second excess bias voltage and the third excess bias voltage may be increased until being equal to the first excess bias voltage.

The optical sensor may comprise a first mode of operation wherein all photodetectors operate as first photodetectors and all control units operate as first control units, and a second mode of operation wherein some photodetectors operate as first photodetectors, some control units operate as first control units, some photodetectors operate as second photodetectors and some control units operate as second control units.

The optical sensor may comprise a first mode of operation wherein all photodetectors operate as first photodetectors and all control units operate as first control units; a second mode of operation wherein some photodetectors operate as first photodetectors, some control units operate as first control units, all other photodetectors operate as second photodetectors and all other control units operate as second control units; and a third mode of operation wherein some photodetectors operate as first photodetectors, some control units operate as first control units, some photodetectors operate as second photodetectors, some control units operate as second control units, some photodetectors operate as third photodetectors and some control units operate as third control units.

According to another aspect, there is provided an apparatus comprising any one of the above optical sensors.

The apparatus may comprise a depth map camera, a mobile phone, a tablet computer, a desktop computer, a laptop computer, a video game console, a video door or a smart watch, an automotive vehicle (e.g., car, truck), etc.

According to another aspect, a method of operating an optical sensor comprises reverse biasing at least one photodetector above a breakdown voltage by an excess bias voltage; and adjusting the reverse bias of the at least one photodetector.

According to another aspect, an optical sensor comprises at least one photodetector configured to be reverse biased at a voltage exceeding a breakdown voltage by an excess bias voltage, at least one controlled resistance controlled by a control signal to quench the at least one photodetector upon absorption of a photon by the at least one photodetector, and at least one control unit configured to adjust the control signal so that the at least one controlled resistance is fixed over time.

The at least one photodetector may be a single photon avalanche diode (SPAD).

The at least one controlled resistance may comprise a controlled switch. The controlled switch may comprise a transistor. The transistor may comprise a metal oxide (MOS) transistor. The metal oxide (MOS) transistor may comprise an N channel metal-oxide-semiconductor (NMOS) transistor or a P channel metal-oxide-semiconductor (NMOS) transistor.

The control unit may comprise: at least one other controlled resistance controlled by the control signal and modeling the at least one controlled resistance; at least one current source supplying a fixed reference current to the at least one other controlled resistance; and at least one component configured to compare a voltage across the at least one other controlled resistance with a fixed reference voltage and to adjust the control signal so that the voltage across the at least one other controlled resistance matches the fixed reference voltage.

The control signal ensures that the at least one other controlled resistance remains equal to a fixed value R.

*R*=Fixed reference voltage/Fixed reference current

The at least one other controlled resistance may be identical to the at least one controlled resistance. In this way, the control signal ensures that the at least one controlled resistance remains and the at least one other controlled resistance both remain equal to R.

The at least one component may comprise an operational amplifier.

The operational amplifier may be configured to compare a voltage across the at least one other controlled resistance and a fixed reference voltage and to adjust a control signal so that the voltage across the at least one other controlled resistance matches with the fixed reference voltage.

The at least one component may comprise an analog to digital converter, a digital voltage regulator and a digital to analog converter.

The analog to digital converter may convert a voltage across the at least one other controlled resistance. The digital voltage regulator may compare the voltage across the at least one other controlled resistance and a fixed reference voltage and adjust a control signal so that the voltage across the at least one other controlled resistance matches the fixed reference voltage. The digital to analog converter may convert the control signal.

BRIEF DESCRIPTION OF THE DRAWINGS

Reference will now be made, by way of example only, to the accompanying drawings in which:

FIG. 10 shows a circuit for controlling and reading out the avalanche diode of FIG. 1 according to an embodiment;

FIG. 11 shows a circuit for controlling and reading out the avalanche diode of FIG. 1 according to another embodiment;

FIG. 12 shows a circuit for controlling and reading out the avalanche diode of FIG. 1 according to another embodiment;

FIG. 13 shows a circuit for controlling and reading out the avalanche diode of FIG. 1 according to another embodiment;

FIG. 14 shows an arrangement of an array of avalanche diodes according to an embodiment;

FIG. 18 shows an arrangement of an array of avalanche diodes according to another embodiment;

DETAILED DESCRIPTION OF ILLUSTRATIVE EMBODIMENTS

Figure 1:
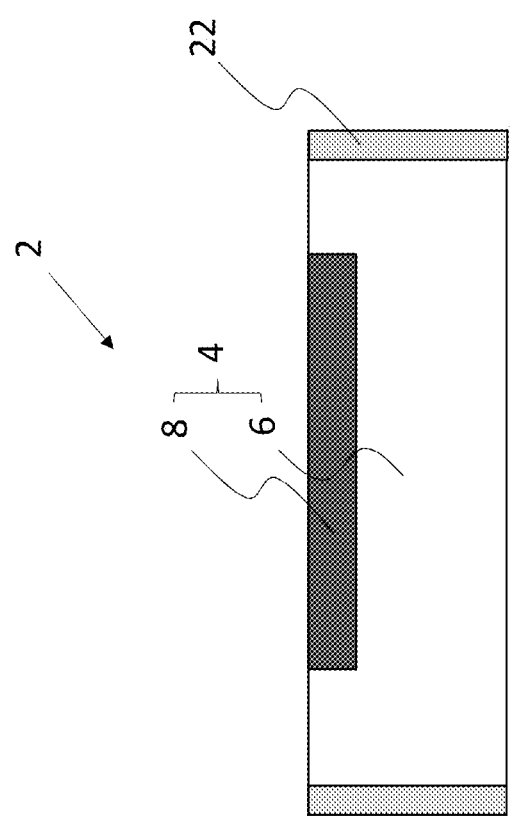
FIG. 1 shows a cross-section of an avalanche diode.

A diode is an electrical device allowing current to move through it in one direction with far greater ease than in the other. The most common kind of diode in modern circuit design is the semiconductor diode and is based on a PN junction.

A PN junction includes a P region (i.e., region doped with a P dopant) and an N region (i.e., region doped with an N dopant type). The N region contains electrons in excess while the P region contains holes in excess. When the PN junction is formed holes are naturally diffused from the P region to the N region and recombined with electrons. Likewise, electrons are naturally diffused from the N region to the P region and are recombined with holes. In this way, a depletion region with pairs of recombined holes and electrons is formed at the interface (i.e., the junction) of the P region and the N region.

The diffusion of holes from the P region leaves negative acceptor ions in the P region while the diffusion of electrons from the N region leaves positive donor ions in the N region. This creates a depletion region electric field that provides a force opposing the continued diffusion of holes and electrons. When the depletion region electric field is sufficiently high the diffusion of holes and electrons is interrupted and the depletion region reaches an equilibrium.

The width of the depletion region depends on the concentration of holes in the P region, the concentration of electrons in the N region and a voltage supply applied to the PN junction.

When the voltage supply is a forward bias voltage supply, the P region is connected with a positive terminal of the voltage supply and the N region is connected with a negative terminal of the voltage supply. In this way, the holes in the P region and the electrons in the N region are pushed toward the interface of the P region and the N region. The width of the depletion region decreases.

When the voltage supply is a reverse bias voltage supply, the P region is connected with a negative terminal of the voltage supply and the N region is connected with a positive terminal of the voltage supply. In this way, the holes in the P region and the electrons in the N region are pushed away from the interface of the P region and the N region. The width of the depletion region increases.

The width of the depletion region increases with the increase in reverse bias voltage supply up to a voltage. If the reverse bias voltage supply is increased beyond that voltage, the junction breaks down and allows a reverse current. At this point, a small increase in the voltage will rapidly increase the reverse current. The voltage at which the PN junction breaks down occurs is known as the "breakdown voltage."

The depletion region breakdown may be caused by two mechanisms: Zener breakdown and avalanche breakdown.

In avalanche breakdown, when the reverse voltage supply exceeds the breakdown voltage, electrons diffused in the depletion region are accelerated. The electrons collide with atoms and free bound electrons. Some of these electrons recombine with holes. Others are accelerated in the depletion region, collide with atoms and free further bound electrons, and so on. Likewise, holes diffused in the depletion region area are accelerated in the opposite direction and initiate a similar process. In this way, a self-sustaining avalanche is created and the reverse current increases.

An avalanche diode, such as a single photon avalanche detectors (SPAD), follows the above principle. The PN junction is reverse biased at a voltage exceeding the breakdown voltage. When a photon with sufficient energy is absorbed, a bound electron is freed in the depletion region. The electron is accelerated, collides with atoms and frees further bound electrons. Some of these electrons recombine with holes. Others are accelerated, collide with atoms and free further bound electron, and so on. Likewise, holes diffused in the depletion region area are accelerated in the opposite direction and initiate a similar process. In this way, a self-sustaining avalanche is created and the reverse current increases. The avalanche can be stopped by setting the reverse bias voltage supply below the breakdown voltage.

FIG. 1 represents an avalanche diode 2, for example, a single photon avalanche diode (SPAD).

The avalanche diode 2 comprises a PN junction 4 including a P region 6 (i.e., a region doped with a P dopant) and an N region 8 (i.e., a region doped with an N dopant). In an implementation, the P region 6 is an epitaxial layer of P dopant type grown on a Silicon substrate (not represented) and the N region 8 is a well of N dopant type formed within the epitaxial layer. Here, the N region 8 is centered (i.e., aligned with a central longitudinal axis). The PN junction 4 comprises a depletion region (also known as depletion layer or depletion zone) that is naturally formed at the interface (i.e., junction) of the P region 6 and the N region 8 as described above.

The avalanche diode 2 comprises an anode (not represented) connecting the P region 6 to a negative terminal of a voltage supply 10 and a cathode (not represented) connecting the N region 8 to a positive terminal of the voltage supply 12.

The avalanche diode 2 may advantageously comprise a trench isolation region 22 surrounding the PN junction 4 to prevent current leakage from/toward adjacent semiconductor device components. The trench isolation region 22 is for example made of Silicon Dioxide ($SiO_2$).

The avalanche diode 2 shown in FIG. 1 may be a back side illuminated avalanche diode so that the amount of light captured can be increased and low-light performance can be improved. As discussed above, when a photon with sufficient energy is absorbed via the back side, a bound electron is freed in the depletion region, accelerated, collides with atoms and free further bound electrons. Some of these electrons recombine with holes. Others are accelerated in, collide with atoms and free further bound electrons, and so on.

Figure 2:
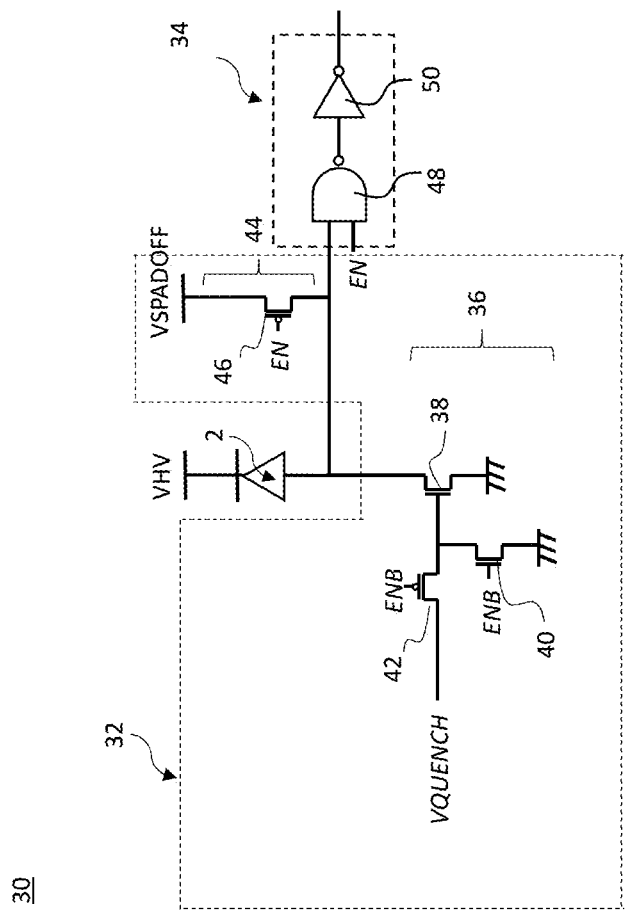
FIG. 2 shows a circuit for controlling and reading out the avalanche diode of FIG. 1.

FIG. 2 represents a circuit 30 for controlling and reading out the avalanche diode 2 of FIG. 1.

The circuit 30 comprises a control unit 32 for activating and deactivating the avalanche diode 2 and a read out unit 34 for reading out the avalanche diode 2. It is understood that the control unit can include multiple circuits.

The control unit 32 comprises an active pull down module 36 designed to set the reverse bias voltage of the avalanche diode 2 to exceed the breakdown voltage by an excess bias voltage and therefore to activate the avalanche diode 2. Here, the active pull down module 36 is configured to pull down the voltage of the anode of the avalanche diode 2.

The active pull down module 36 includes switches 38, 40 and 42 to selectively connect and disconnect the anode of the avalanche diode 2 to the ground. Here, the switch 38 is formed by an N channel metal-oxide-semiconductor (NMOS) transistor. The switch 38 includes a drain connected to the anode of the avalanche diode 2, a source connected to the ground voltage and a gate controlled by the switch 40 and 42. The switch 40 is formed by an NMOS transistor. The switch 40 includes a drain connected to the gate of the switch 38, a source connected to the ground and a gate controlled by a disable signal (ENB). The switch 42 is formed by a P channel metal-oxide-semiconductor (PMOS) transistor. The switch 42 includes a source connected to the gate of the switch 38, a drain connected to a VQUENCH voltage supply and a gate controlled by ENB. VQUENCH may for example be comprised between 1.1 and 1.8V.

The switch 38 operates as a controlled resistance. The higher VQUENCH, the lower the resistance. The lower VQUENCH, the higher the resistance.

The control unit 32 comprises a VHV (high voltage) voltage supply connected to a cathode of the avalanche photodiode 2. VHV is equal to the breakdown voltage plus the excess bias voltage. VHV may for example be comprised between 10V and 25V.

The control unit 32 comprises an active pull up module 44 designed to set the reverse bias voltage below the breakdown voltage and therefore to disable the avalanche diode 2.

The active pull up module 44 is configured to pull up the potential of the anode of the avalanche diode 2. The active pull up module 44 includes a switch 46 to connect and disconnect the anode of the avalanche diode 2 to a VSPAD-OFF voltage supply.

Here, the switch 46 is formed by a PMOS transistor. The switch 46 includes a drain connected to the anode of the avalanche diode 2, a source connected to the VSPADOFF voltage supply and a gate controlled by an enable signal (EN).

It will be understood that ENB and EN alternate between a high voltage and a low voltage. ENB is the inverse of EN. ENB and EN may be generated by any suitable circuit. For example ENB and EN may be generated by an addressable memory cell associated with the avalanche diode 2 such as a static random-access memory (SRAM) memory cell inverter loop.

The readout unit 34 comprises a NAND gate 48 and an inverter 50. The NAND gate 48 comprises an input connected to the anode of the avalanche diode 2 and an input controlled by EN. The NAND gate 48 comprises an output connected to an input of the inverter gate 50. The NAND gate comprises a voltage threshold (Vth) such that when EN is at a high voltage and the voltage of the anode of the avalanche diode 2 is above Vth, the output of the NAND gate 48 is at a high voltage. Alternatively, when EN is at a low voltage and/or the voltage of the anode of the avalanche diode 2 is below Vth, the output of the NAND gate 48 is at a low voltage.

Figure 3:
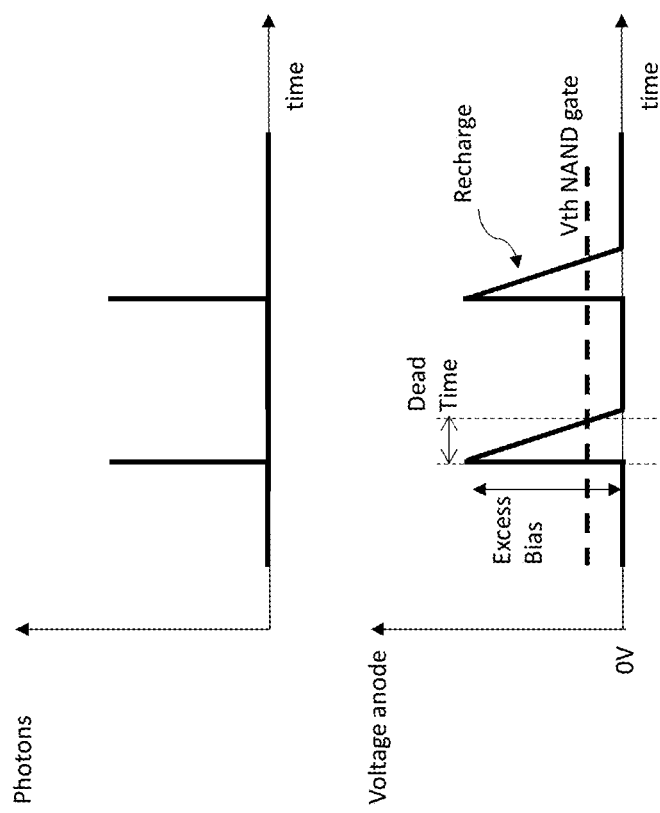
FIG. 3 shows a graph illustrating a voltage of an anode of the avalanche diode of FIG. 1 when incident photons are absorbed.

FIG. 3 shows a graph illustrating the voltage of the anode of the avalanche diode 2 when photons are absorbed.

When EN is at a high voltage and ENB is at a low voltage, the switches 38, 40 and 42 connect the anode of the avalanche diode 2 to the ground. The switch 46 disconnects the anode of the avalanche diode 2 from the VSPADOF voltage supply. The reverse bias voltage of the avalanche diode 2 is pulled above the breakdown voltage by an excess bias voltage and the avalanche diode 2 is activated.

When a photon is absorbed by the avalanche diode 2 an avalanche is generated. The reverse current flowing through the avalanche diode 2 increases sharply (i.e., due to the recombination of electrons and holes in the depletion region), causing the voltage on the anode of the avalanche diode 2 to increase sharply. When the voltage of the anode of the avalanche diode 2 passes above Vth of the NAND gate 48, the output of the readout unit 34 switches to a high voltage.

The voltage of the anode of the avalanche diode 2 keeps increasing until it reaches the excess bias voltage. The reverse bias voltage is then equal to the breakdown voltage. The avalanche is interrupted (i.e., the avalanched diode 2 quenched). The voltage of the anode of the avalanche diode 2 decreases, the reverse current flowing through the avalanche diode 2 remains approximately nil. When the voltage of the anode of the avalanche diode 2 passes below Vth of the NAND gate 48, the output of the readout unit switches to a low voltage. In this way, a pulse is generated. The avalanche diode 2 is reset. Another avalanche may be triggered and another pulse may be generated.

The time required for the voltage of the anode of the avalanche diode 2 to decrease from the excess bias voltage to Vth of the NAND gate 48 is referred as a dead time because no pulse can be generated during this time. The dead time of the avalanche diode 2 may be adjusted by adjusting VQUENCH. The higher VQUENCH, the lower the resistance 38 and the shorter the dead time of the avalanche diode 2. The lower VQUENCH, the higher the resistance 38 and the longer the dead time of the avalanche diode 2.

When EN is at a low voltage and ENB is at a high voltage, the switches 38, 40 and 42 disconnect the anode of the avalanche diode 2 from the ground. The switch 46 connects the anode of the avalanche diode 2 to the VSPADOF voltage supply. The reverse bias voltage is pulled below the breakdown voltage and the avalanche diode 2 is deactivated.

When a photon is absorbed by the avalanche diode 2 no avalanche is generated because the reverse bias voltage is below the breakdown voltage. The voltage of the anode of the avalanche diode 2 remains approximatively nil the reverse current flowing through the avalanche diode 2 remains approximately nil. No pulse is generated by the readout unit 34 despite the absorption of the photon.

Figure 4:
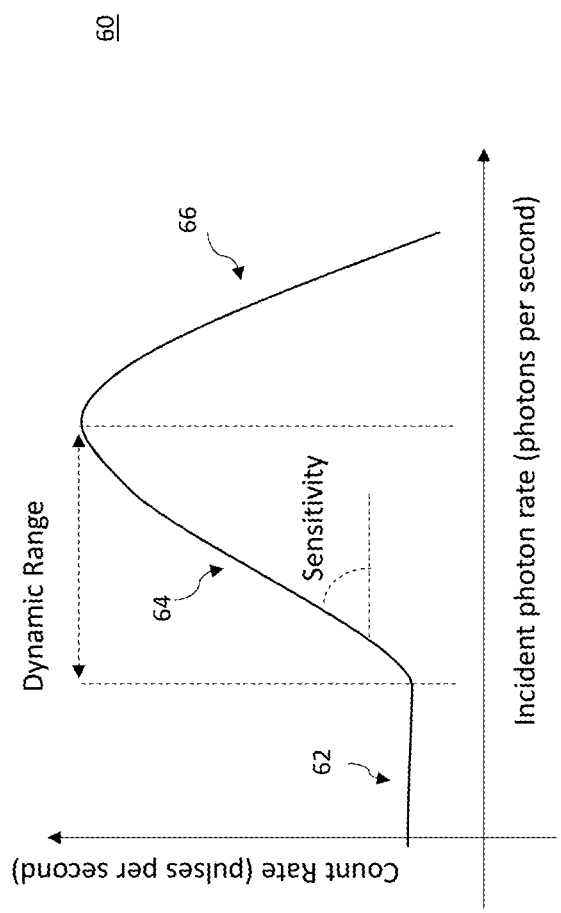
FIG. 4 shows a graph illustrating the variation of a count rate of the avalanche diode of FIG. 1 in response to the variation of an incident photon rate.

FIG. 4 shows a graph 60 illustrating the variation of the count rate (i.e., number of pulses generated per second) of the avalanche diode 2 in response to the variation of the incident photons rates (i.e., number of photons absorbed per second).

The graph 60 comprises a dark current region 62, an operation region 64 and a pile-up region 66.

In the dark current region 62, the incident photon rate is so low that an insignificant number of avalanches are triggered by the absorption of incident photons. The count rate is substantially constant.

In the operation region 64, the count rate linearly increases.

In the pile-up region 66, the incident photon rate is so high that after triggering an avalanche, the avalanche diode 2 saturates and cannot be reset below the breakdown voltage. In this phase the count rate decreases as to zero as the photon rate increases as the arriving photons cause charges to be generated quicker than they can be swept out of the diode to restore the diode above the breakdown voltage.

The avalanche diode 2 is only operational in the operation region 64. That is, the avalanche diode 2 is unusable in the dark current region 62 and the pile-up region 66.

The operation region 64 defines the sensitivity and the dynamic range of the avalanche diode 2. As can be seen on FIG. 4, the sensitivity may be represented as the angle of the operation region 64. The dynamic range may be represented as the width of the operation region 64. The dynamic range may be expressed in decibels and may typically be comprised between 100 dB and 120 dB.

Figure 5:
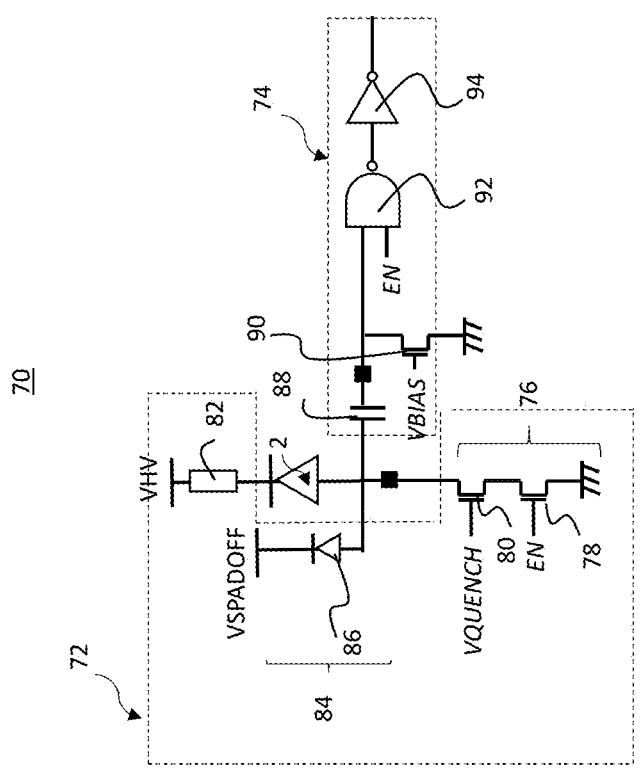
FIG. 5 shows another circuit for controlling and reading out the avalanche diode of FIG. 1.

FIG. 5 represents another circuit 70 for controlling and reading out the avalanche diode 2 of FIG. 1.

The circuit 70 comprises a control unit 72 for activating and deactivating the avalanche diode 2 and a read out unit 74 for reading out the avalanche diode 2.

The control unit 72 comprises an active pull down module 76 designed to set the reverse bias voltage to exceed the breakdown voltage by an excess bias voltage and therefore to activate the avalanche diode 2. Here, the active pull down module 76 is configured to pull down the voltage of the anode of the avalanche diode 2.

The active pull down module 76 includes switches 78 and 80 forming a cascode arrangement. The switches 78 and 80 are configured to connect and disconnect the anode of the avalanche diode 2 to the ground. Here, the switch 78 is formed by an NMOS transistor. The switch 78 includes a drain connected to the source of the switch 80, a source connected to the ground and a gate controlled by EN. The switch 80 is formed by an NMOS transistor. The switch 80 includes a drain connected to the anode of the avalanche diode 2, a source connected to the drain of the switch 78 and a gate connected to a VQUENCH voltage supply.

The switch 80 operates as a controlled resistance. The higher VQUENCH, the lower the resistance. The lower VQUENCH, the higher the resistance.

Again, it will be understood that EN alternate between a high voltage and a low voltage. EN may be generated by any suitable circuit. For example EN may be generated by an addressable memory cell associated with the avalanche diode 2.

The control unit 72 comprises a VHV voltage supply connected to a cathode of the avalanche photodiode 2 via a resistance 82.

The control unit 72 comprises a passive pull up module 84 designed to set the reverse bias voltage below the breakdown voltage and therefore disable the avalanche diode 2. The passive pull up module 84 is configured to pull up the voltage of the anode of the avalanche diode 2. The passive pull up module 44 includes a clamp diode 86 to connect and disconnect the anode of the avalanche diode 2 to a VSPADOFF voltage supply.

The readout unit 74 comprises a capacitor 88 and a switch 90. Here, the switch 90 is an NMOS transistor. The capacitor 88 is connected to the anode of the avalanche diode 2 and a drain of the switch 90. A source of the switch 90 is connected to the ground and a gate of the switch 90 is connected to a VBIAS voltage supply. The switch 90 operates a controlled resistance. The higher VBIAS, the lower the resistance. The lower VBIAS, the higher the resistance. The capacitor 88 and the switch 90 therefore form an 'RC' type high pass filter. The bandwidth of the high pass filter may be adjusted by adjusting VBIAS.

The readout unit 74 comprises a NAND gate 92 and an inverter 94. The NAND gate 92 comprises an input connected to the drain of the switch 90 and an input controlled by EN. The NAND gate 92 comprises an output connected to an input of the inverter gate 94. The NAND gate 92 comprises a threshold (Vth) such that when EN is at a high voltage and the voltage at the drain of the switch 90 is above Vth, the output of the NAND gate 92 is at a high voltage. Alternatively, when EN is at a low voltage and/or the voltage at the drain of the switch 90 is below Vth, the output of the NAND gate 92 is at a low voltage.

In an implementation, the avalanche diode 2 and the circuit 70 may be stacked on top of each other using three dimensional stacking techniques (as symbolized by the black squares on FIG. 5).

When EN is at a high voltage, the switches 78 and 80 connect the anode of the avalanche diode 2 to the ground. The reverse bias voltage is pulled above the breakdown voltage and the avalanche diode 2 is activated. The diode 86 is not conducting (i.e., the voltage between the cathode and the anode of the diode 86 is below a threshold of the diode 86) and disconnects the anode of the avalanche diode 2 from the VSPADOFF voltage supply.

When a photon is absorbed by the avalanche diode 2 an avalanche is generated. The reverse current flowing through the avalanche diode 2 increases sharply (i.e., due to the recombination of electrons and holes in the depletion region) causing the voltage of the anode of the avalanche diode 2 to increase sharply. When the voltage of the anode of the avalanche diode 2 passes above Vth of the NAND gate 48, the output of the readout unit 34 switches to a high voltage.

The voltage of the anode of the avalanche diode 2 keeps increasing until it reaches the excess bias voltage. The reverse bias voltage is then equal to the breakdown voltage. The avalanche is interrupted (i.e., the avalanche diode is quenched). The voltage of the anode of the avalanche diode 2 decreases and the reverse current flowing through the avalanche diode 2 remains approximately nil. When the voltage of the anode of the avalanche diode 2 passes below Vth of the NAND gate 48, the output of the readout unit switches to the low voltage. In this way, a pulse is generated. The avalanche diode 2 is reset. Another avalanche may be triggered and another pulse may be generated.

When EN is at a low voltage, the switches 78 and 80 disconnect the anode of the avalanche diode 2 from the ground. In this way, the reverse bias voltage is left floating above the breakdown voltage. The diode 86 is still non-conducting (i.e., the voltage between the cathode and the anode of the diode 86 is still below the threshold) and disconnects the anode of the avalanche diode 2 to the VSPADOFF voltage supply.

When a photon is absorbed by the avalanche diode 2 an avalanche is generated. The voltage of the anode of the avalanche diode 2 increases sharply, the reverse current flowing through the avalanche diode 2 increases sharply (i.e., due to the recombination of electrons and holes in the depletion region). When the voltage of the anode of the avalanche diode 2 passes above the threshold of the NAND gate 48, the output of the readout unit 34 switches to a high voltage.

The voltage of the anode of the avalanche diode 2 keeps increasing until it reaches the excess bias voltage. The reverse bias voltage is then equal to the breakdown voltage. The avalanche is interrupted (i.e., the avalanche diode is quenched). The voltage of the anode of the avalanche diode 2 decreases and the reverse current flowing through the avalanche diode 2 remains approximately nil. When the voltage of the anode of the avalanche diode 2 passes below the threshold of the NAND gate 48, the output of the readout unit switches to the low voltage. In this way, a pulse is generated. The avalanche diode 2 is reset. Another avalanche may be triggered and another pulse may be generated.

It will be understood that as the voltage of the anode of the avalanche diode increases, the diode 86 starts conducting (i.e., the voltage between the cathode and the anode of the diode 86 is above the threshold of the diode 86) and connects the anode of the avalanche diode 2 to the VSPADOFF supply voltage. In this way, the anode of the avalanche diode 2 is maintained approximatively at the VSPADOFF supply voltage (i.e., minus the threshold) and the reverse bias voltage is maintained below the breakdown voltage. The avalanche diode is deactivated.

When a photon is absorbed by the avalanche diode 2 no avalanche is generated because the reverse bias voltage is below the breakdown voltage. The voltage of the anode of the avalanche diode 2 remains approximatively nil and the reverse current flowing through the avalanche diode 2 remains approximately nil. No pulse is generated by the readout unit 34 despite the absorption of the photon.

The avalanche diode 2 and the circuits 30 and 70 described above may be used in optical sensors such as Light Detection and Ranging (LIDAR) sensors or time of flight (TOF) sensors.

An optical sensor comprises a photoemitter for emitting photons (e.g., infrared photons) toward a target object and a plurality of photodetectors for receiving photons reflected by the target object. The proximity and/or distance between the optical sensor and the target object may be determined based on the time of flight of the photons emitted by the photoemitter and received by the plurality of photodetectors. The longer the time of flight, the longer the distance between the optical sensor and the target object. The shorter the time of flight, the shorter the distance between the optical sensor and the target object. The photoemitter may be a vertical cavity surface-emitting laser (VCSEL) beam. The plurality of photodetectors may be a plurality of avalanche diodes 2.

In some optical sensors all photodetectors have the same characteristics (i.e., same sensitivities and same dynamic ranges). An issue with such optical sensors is that the overall dynamic range of the optical sensor is equal to the dynamic range of a single photodetector and therefore only covers a narrow range of incident photon rates.

The incident photon rate received by the photodetectors may depend on the distance to the object reflecting the photons (i.e., the incident photon rate decreases as a square root function of the distance) and/or the level of ambient light. The shorter the distance, the higher the incident photon rate. The longer the distance, the lower the incident photon rate. The higher the level of ambient light, the higher the incident photon rate. The lower the level of ambient light, the lower the incident photon rate.

The overall dynamic range of some optical sensors may be adapted to operate with objects at long distances and/or low level ambient light (i.e., low incident photon rates) but may not be adapted to operate with objects at short distances and/or high level ambient light (i.e., high incident photon rates). Alternatively, the overall dynamic range of other optical sensors may be adapted to operate with objects at short distances and/or high level ambient light (i.e., high incident photon rates) but may not be adapted with objects at long distances and/or low level ambient light (i.e., low incident photon rates).

To address this problem, in some optical sensors the photodetectors are configured with different characteristics (i.e., different sensitivities and different dynamic ranges). For example, it has been proposed to optically adjust the characteristics of some photodetectors by placing a non-uniform optical grid on the photodetectors. In other words, some photodetectors are configured with small apertures whilst others are configured with large apertures.

In this way, the dynamic range of the photodetectors with the small apertures is shifted to the right (i.e., to the higher incident photon rates) with regard to the dynamic range of the photodetectors with the large apertures. The overall dynamic range of the optical sensor is the combination of the dynamic range of the photodetectors with the small apertures and the dynamic range of the photodetectors with the large apertures. The overall dynamic range of the optical sensor is increased.

The photodetectors with small apertures are adapted to operate with objects at short distances and/or high level ambient light (i.e., high incident photon rates) whilst the photodetectors with large apertures are adapted to operate with objects at long distances and/or low level ambient light (i.e., low incident photon rates). Accordingly, the optical sensor may operate with a wide range of distances and a wide range of level of ambient light.

Figure 6:
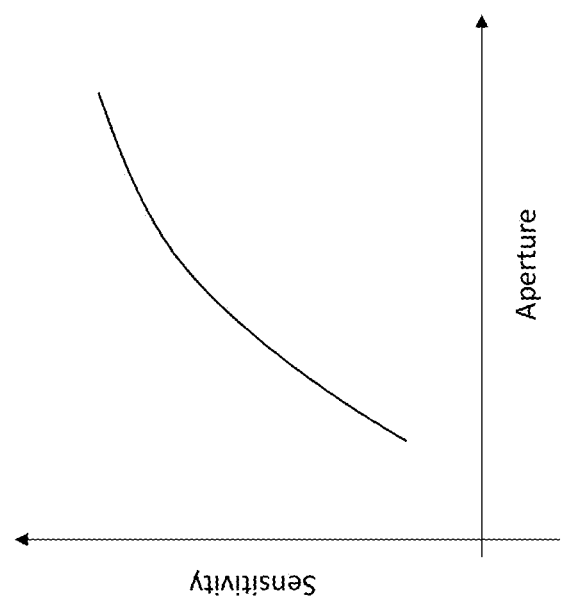
FIG. 6 shows a graph illustrating the variation of the sensitivity of the avalanche diode of FIG. 1 in response to the variation of an incident photon rate.

FIG. 6 shows a graph illustrating the variation of the sensitivity of an avalanche diode 2 in response to the variation of the aperture of the avalanche diode 2. As can be seen, the smaller the aperture of the avalanche diode 2, the lower the sensitivity of the avalanche diode 2.

Figure 7:
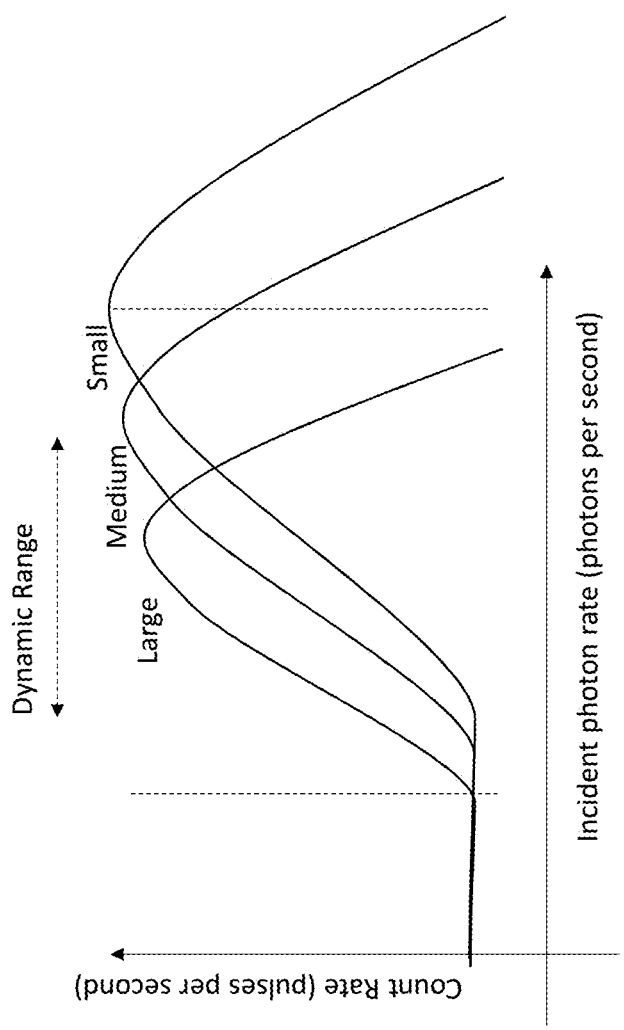
FIG. 7 shows a graph illustrating the variation of the dynamic range of the avalanche diode of FIG. 1 in response to the variation of an incident photon rate.

FIG. 7 shows a graph illustrating the variation of the dynamic range of an avalanche diode in response to the variation of the aperture of the avalanche diode 2. As can be seen, the smaller the aperture of the avalanche diode 2, the more the dynamic range of the avalanche diode 2 is shifted to the right (i.e., high incident photon rate).

A problem with these optical sensors is that the photodetectors with small apertures may sub-sample with regard to the photodetectors with large apertures. Accordingly, the increase in the overall dynamic range of optical sensor comes at the expense of a reduction of sensitivity of some photodetectors and an increase in their structural complexity.

Some of the following embodiments propose to address this problem by electrically adjusting the characteristics of photodetectors as opposed to optically adjusting the characteristics of photodetectors. More specifically, the excess bias of photodetectors may be adjusted so that some photodetectors have higher excess bias than others.

The dynamic range of the photodetectors with the higher excess bias may be shifted to the left (i.e., to the lower incident photon rates) with regard to the dynamic range of the photodetectors with the lower excess bias. The photodetectors with the lower excess bias are adapted to operate with objects at short distances and/or high level ambient light (i.e., high incident photon rates) whilst the photodetectors with the higher excess bias are adapted to operate with objects at long distances and/or low level ambient light (i.e., low incident photon rates). The photodetectors with the higher excess bias have a greater sensitivity than the photodetectors with the lower excess bias.

An advantage of some of the following embodiments is that the overall dynamic range of the optical sensor may be increased at minimum expense for the sensitivity of the photodetectors and at minimum structural complexity.

Figure 8:
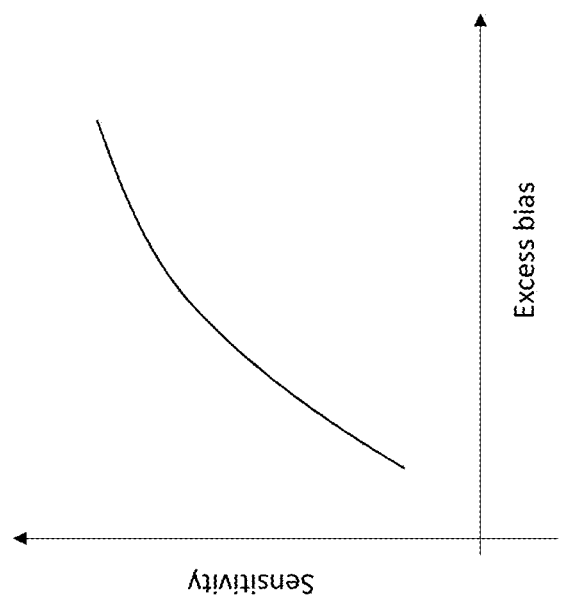
FIG. 8 shows a graph illustrating the variation of the sensitivity of the avalanche diode of FIG. 1 in response to the variation of an excess bias.

FIG. 8 shows a graph illustrating the variation of the sensitivity of the avalanche diode 2 in response to the variation of the excess bias of the avalanche diode 2. As can be seen, the higher the excess bias of the avalanche diode 2, the higher the sensitivity of the avalanche diode 2.

Figure 9:
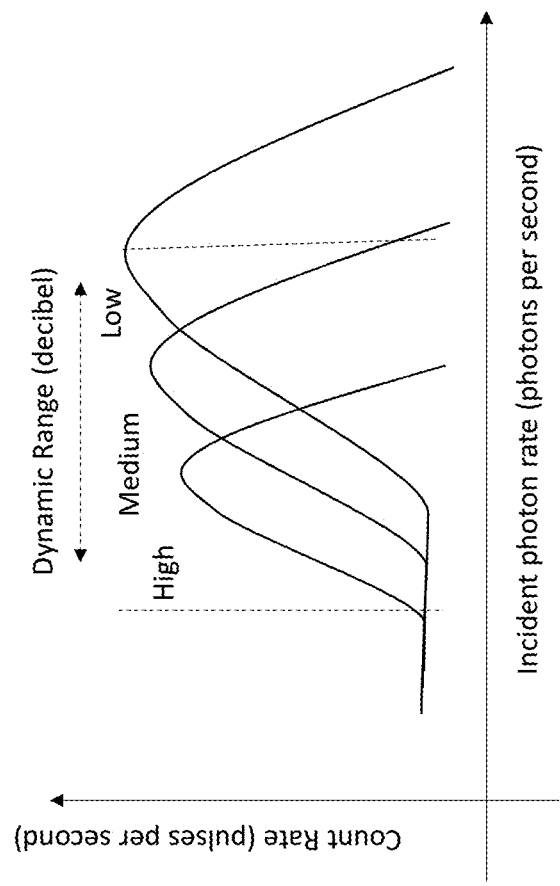
FIG. 9 shows a graph illustrating the variation of the dynamic range of the avalanche diode of FIG. 1 in response to the variation of an excess bias.

FIG. 9 shows a graph illustrating the variation of the dynamic range of the avalanche diode 2 in response to the variation of the excess bias of the avalanche diode 2. As can be seen, the higher the excess bias of the avalanche diode 2, the more the dynamic range of the avalanche diode 2 is shifted to the left (i.e., low incident photon rate).

FIG. 10 represents a circuit 100 for controlling and reading out the avalanche diode 2. The circuit 100 comprises a control unit 132 for activating and deactivating the avalanche diode 2 and the readout unit 74 (shown on FIG. 5) for reading out the avalanche diode 2. It will be understood that the readout unit 74 could be replaced by the readout unit 34 (shown on FIG. 2) or any suitable readout unit.

The control unit 132 is identical to the control unit 32 (shown on FIG. 2) except that the source of the switch 38 is connected to a VOFFSET voltage supply and the drain of the switch 42 is connected to a VQUENCH+VOFFSET voltage supply.

VOFFSET may be adjusted to adjust the excess bias voltage of the avalanche diode 2. The lower VOFFSET, the higher the excess bias voltage of the avalanche diode 2. The higher VOFFSET, the lower the excess bias voltage of the avalanche diode 2. VOFFSET may be adjusted with continuous values (e.g., any value comprised between 0V and 1V) or discrete values (e.g., any value equal to 0V, 0.5V or 1V).

VQUENCH may also be adjusted to adjust the dead time of the avalanche diode 2. The lower VQUENCH, the longer the dead time of the avalanche diode 2. The higher VQUENCH, the shorter the dead time of the avalanche diode 2. VQUENCH may be adjusted with continuous values or discrete values.

FIG. 11 represents a circuit 200 for controlling and reading out the avalanche diode 2. The circuit 200 comprises a control unit 232 for activating and deactivating the avalanche diode 2 and the readout unit 74 (shown on FIG. 5) for reading out the avalanche diode 2. It will be understood that the read out unit 74 could be replaced by the readout unit 34 (shown on FIG. 2) or any suitable readout unit.

The control unit 272 is identical to the control unit 72 (shown on FIG. 5) except that the source of the switch 78 is connected to a VOFFSET voltage supply and the gate of the switch 80 is connected to a VQUENCH+VOFFSET voltage supply.

It will be understood that to operate the enable signal (EN) is configured so that the high voltage of the enable signal (EN) is greater than the voltage VOFFSET plus a voltage threshold of the switch 78.

VOFFSET may be adjusted to adjust the excess bias voltage of the avalanche diode 2. The lower VOFFSET, the higher the excess bias voltage of the avalanche diode 2. The higher VOFFSET, the lower the excess bias voltage of the avalanche diode 2. VOFFSET may be adjusted with continuous values (e.g., any value comprised between 0V and 1V) or discrete values (e.g., any value equal to 0V, 0.5V or 1V).

VQUENCH may also be adjusted to adjust the dead time of the avalanche diode 2. The lower VQUENCH, the longer the dead time of the avalanche diode 2. The higher VQUENCH, the shorter the dead time of the avalanche diode 2. VQUENCH may be adjusted with continuous values or discrete values.

FIG. 12 represents a circuit 300 for controlling and reading out the avalanche diode 2. The circuit 300 comprises a control unit 332 for activating and deactivating the avalanche diode 2 and the read out unit 74 (shown on FIG. 5) for reading out the avalanche diode 2. It will be understood that the read out unit 74 could be replaced by the readout unit 34 (shown on FIG. 2) or any suitable readout unit.

The control unit 332 is identical to the control unit 132 (shown on FIG. 10) except that the switch 38 is replaced by a fully depleted silicon on insulator (FDSOI) switch 338. The bulk of the switch 338 is connected to a VBULK voltage supply.

Like the switch 38, the switch 338 operates as a controlled resistance. The higher VQUENCH, the lower the resistance. The lower VQUENCH, the higher the resistance.

VBULK may be adjusted to adjust the dead time of the avalanche diode 2. VBULK may be adjusted with continuous values or discrete values.

FIG. 13 represents a circuit 400 for controlling and reading out the avalanche diode 2. The circuit 400 comprises a control unit 472 for activating and deactivating the avalanche diode 2 and the read out unit 74 (shown on FIG. 5) for reading out the avalanche diode 2. It will be understood that the read out unit 74 could be replaced by the readout unit 34 (shown on FIG. 2).

The control unit 472 is identical to the control unit 272 (shown on FIG. 11) except that the switch 78 is replaced by a fully depleted silicon on insulator (FDSOI) switch 478. The bulk of the switch 478 is connected to a VBULK voltage supply.

VBULK may be adjusted to adjust the dead time of the avalanche diode 2. VBULK may be adjusted with continuous values or discrete values.

Figure 14:
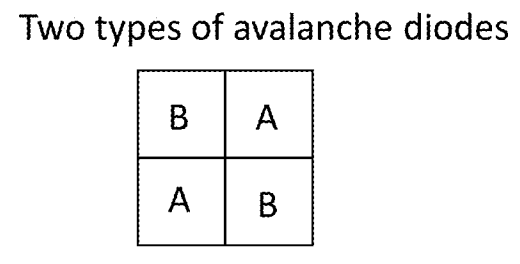

FIG. 14 shows an arrangement of an array of avalanche diodes 2 of an optical sensor. In this arrangement, the array of avalanche diodes 2 comprises two types of avalanches diodes 2: avalanche diodes of a type A and avalanche diodes of a type B. For example, both the avalanche diodes 2 of the type A and the avalanche diodes 2 of the type B are designed to operate with photons of the same wavelength (e.g., infrared photons).

Avalanche diodes 2 of a type A are electrically adjusted with voltages VQUENCHA, VOFFSETA and VBULKA when applicable. Avalanche diodes 2 of a type B are electrically adjusted with voltages VQUENCHB, VOFFSETB and VBULKB when applicable. Here, the avalanche diodes 2 of the type A and the avalanche diodes of the type B are alternated in a row direction and a column direction. However, it will be understood that other arrangements are possible.

Figure 15:
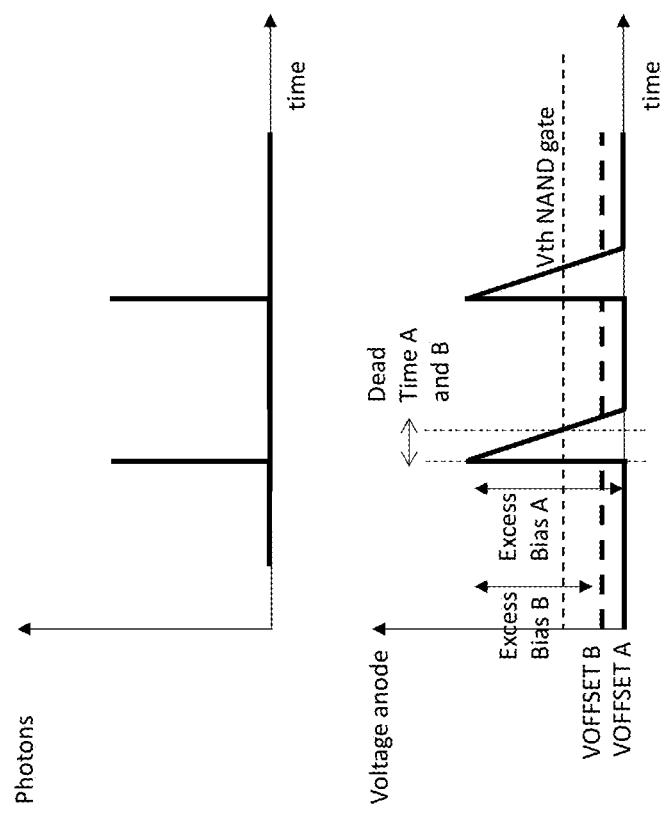
FIG. 15 shows a graph illustrating voltages of anodes of avalanche diodes of FIG. 14 when incident photons are absorbed.

VOFFSETA and VOFFSETB are adjusted so that the excess bias voltage of the avalanche diodes 2 of the type A is higher than the excess bias voltage of the avalanche diodes 2 of the type B (as shown on FIG. 15). For example, VOFFSETA may be equal to 0V and VOFFSETB may be equal to 0.5V.

VQUENCHA and VQUENCHB, and VBULKA and VBULKB when applicable, may also be adjusted so that the dead time of the avalanche diodes 2 of the type A is approximatively equal to the dead time of the avalanche diodes 2 of the type B (as shown on FIG. 15).

Figure 16:
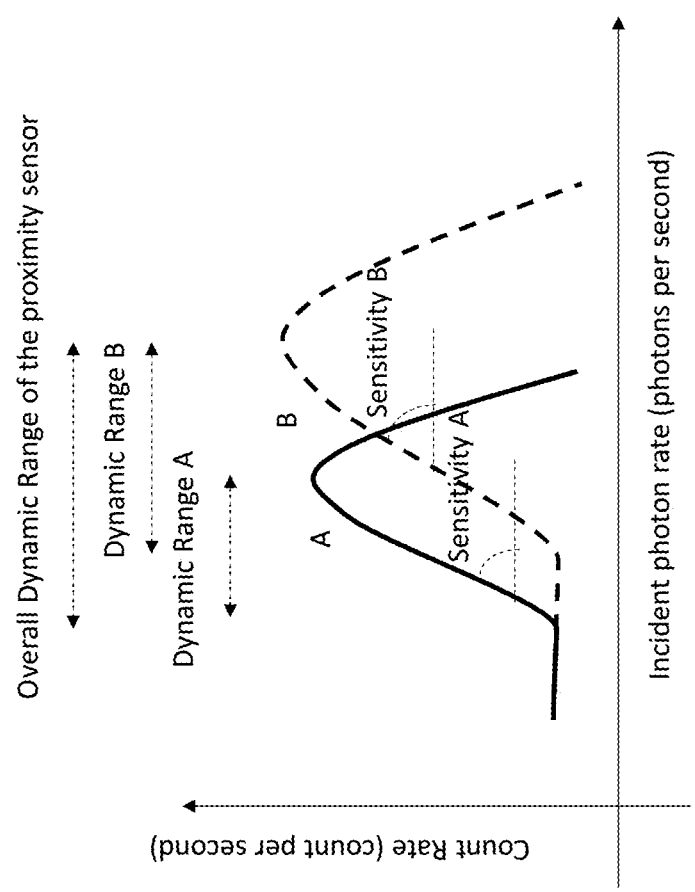
FIG. 16 shows a graph illustrating the variation of a count rate of the avalanche diodes of FIG. 14 in response to the variation of an incident photon rate.

The sensitivity of the avalanche diodes 2 of the type A is higher than the sensitivity of the avalanche diodes 2 of the type B (as shown on FIG. 16).

It will be understood that the same avalanche diode 2 may operate as an avalanche diodes 2 of the type A or B depending how it is electrically adjusted.

The dynamic range of the of the avalanche diodes 2 of the type A is shifted to the left (i.e., to lower incident photon rate) with respect to the dynamic range of the avalanche diodes 2 of the type B (as shown on FIG. 16). In this way, the overall dynamic range of the optical sensor may be increased whilst increase the sensitivity of the avalanche diodes 2 of the type A.

In some embodiments, the optical sensor may switch between a first mode of operation wherein all the avalanche diodes 2 operate as avalanche diodes 2 of the type A and a second mode of operation wherein some of the avalanche diodes 2 operate as avalanche diodes 2 of the type A and other avalanche diodes 2 operate as avalanche diodes 2 of the type B.

In some embodiments, VOFFSETA and VOFFSETB may both be fixed over a shot cycle of the photoemitter of the optical sensor. The shot cycle may for example be equal to 0.2 µs.

Figure 17:
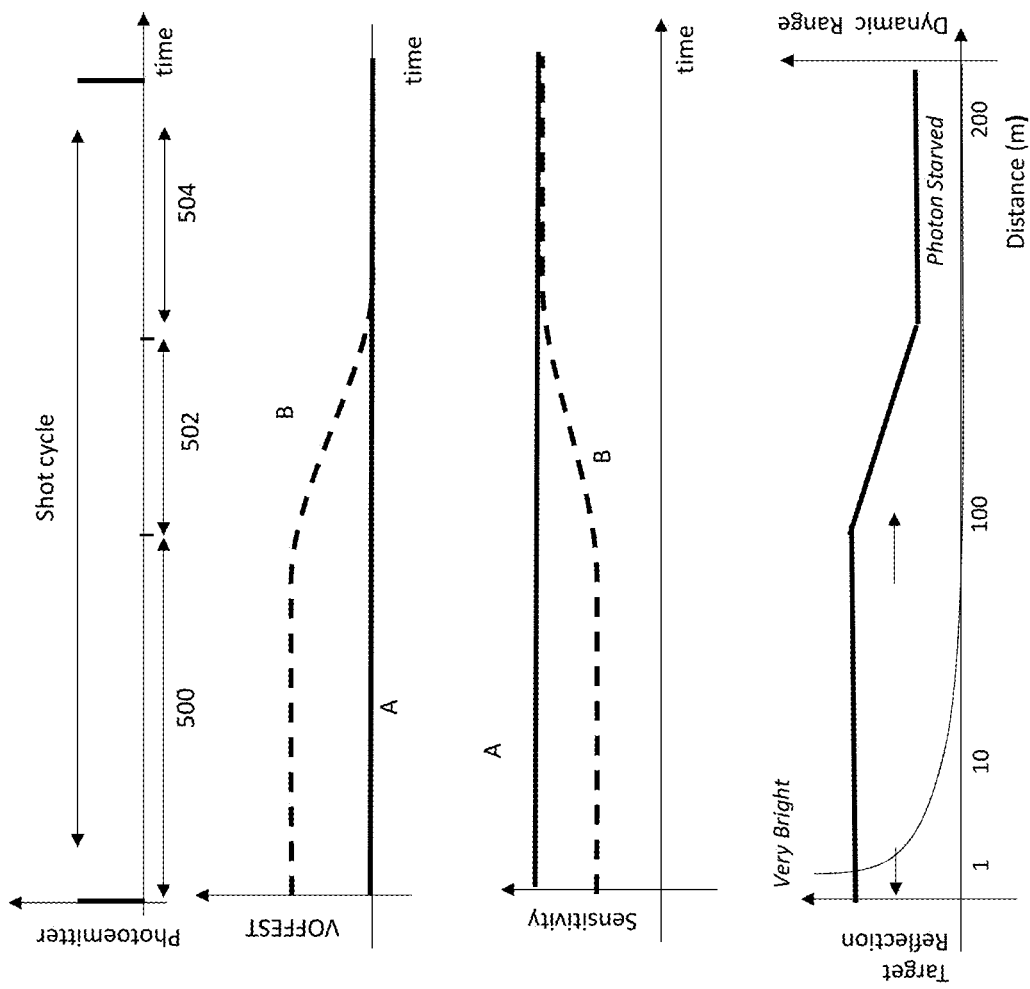
FIG. 17 shows various graphs illustrating the variation of characteristics of the avalanche diodes of FIG. 14 over a shot cycle of a photoemitter.

In some embodiments, VOFFSETA may be fixed over a shot cycle of the photoemitter of the optical sensor and VOFFSETB may be varied over the shot cycle of the photoemitter of the optical sensor (as shown on FIG. 17).

For example, during a first portion 500 of a shot cycle VOFFSETB is fixed. During a second portion 502 of the shot cycle VOFFSETB decreases. For example, VOFFSETB decreases linearly until being equal to VOFFESTA. During a third portion 504 of the shot cycle VOFFSETB is fixed.

In this way, the optical sensor may operate with a wide range of incident photon rates. That is, the optical sensor may detect objects within a wide range of distances and under a wide range of level of ambient lights.

Figure 18:
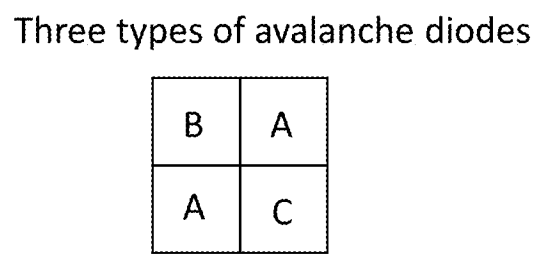

FIG. 18 shows another arrangement of an array of avalanche diodes 2 of an optical sensor. In this arrangement, the array of avalanche diodes 2 comprises three types of avalanches diodes 2: avalanche diodes of a type A, avalanche diodes of a type B and avalanche diodes of a type C. For example, the avalanche diodes 2 of the type A, the avalanche diodes 2 of the type B and the avalanche diodes of the type C are all designed to operate with photons of the same wavelength (e.g., infrared photons).

Avalanche diodes 2 of a type A are electrically adjusted with voltages VQUENCHA, VOFFSETA and VBULKA when applicable. Avalanche diodes 2 of a type B are electrically adjusted with voltages VQUENCHB, VOFFSETB and VBULKB when applicable. Avalanche diodes 2 of a type C are electrically adjusted with voltages VQUENCHC, VOFFSETC and VBULKC when applicable. Here, the arrangement is a Bayer arrangement but it will be understood that other suitable arrangements may be implemented.

Figure 19:
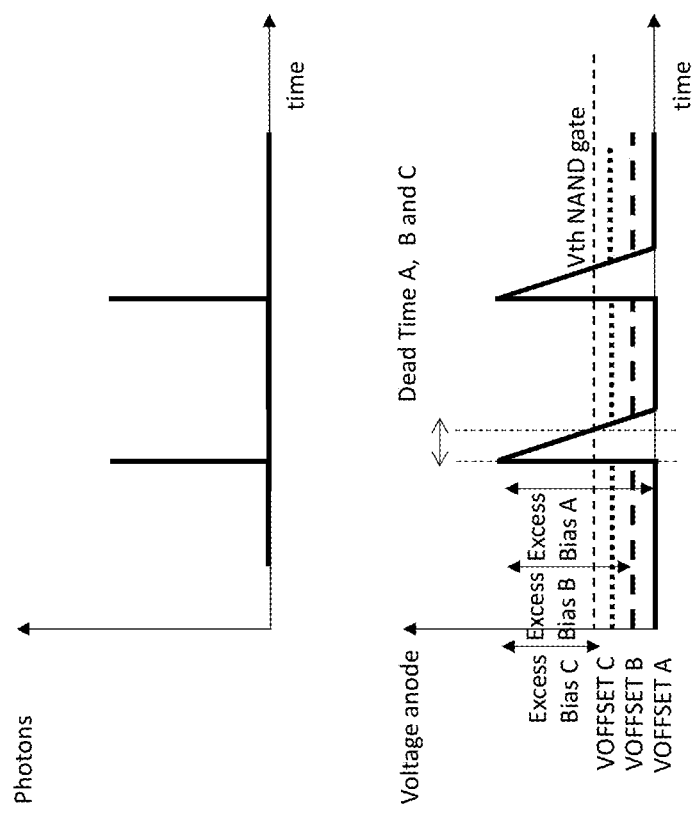
FIG. 19 shows a graph illustrating voltages of anodes of avalanche diodes of FIG. 18 when incident photons are absorbed.

VOFFSETA, VOFFSETB and VOFFSETC are adjusted so that the excess bias voltage of the avalanche diodes 2 of the type A is higher than the excess bias of the avalanche diodes 2 of the type B and the excess bias voltage of the avalanche diodes 2 of the type B is higher than the excess bias of the avalanche diodes 2 of the type C (as shown on FIG. 19). For example, VOFFSETA may be equal to 0V, VOFFSETB may be equal to 0.5V and VOFFSETC may be equal to 1V.

VQUENCHA, VQUENCHB and VQUENCHC, and VBULKA, VBULKB and VBULKC when applicable, may also be adjusted so that the dead time of the avalanche diodes 2 of the type A is approximatively equal to the dead time of the avalanche diodes 2 of the type B and to the dead time of the avalanche diodes 2 of the type C (as shown on FIG. 19).

Figure 20:
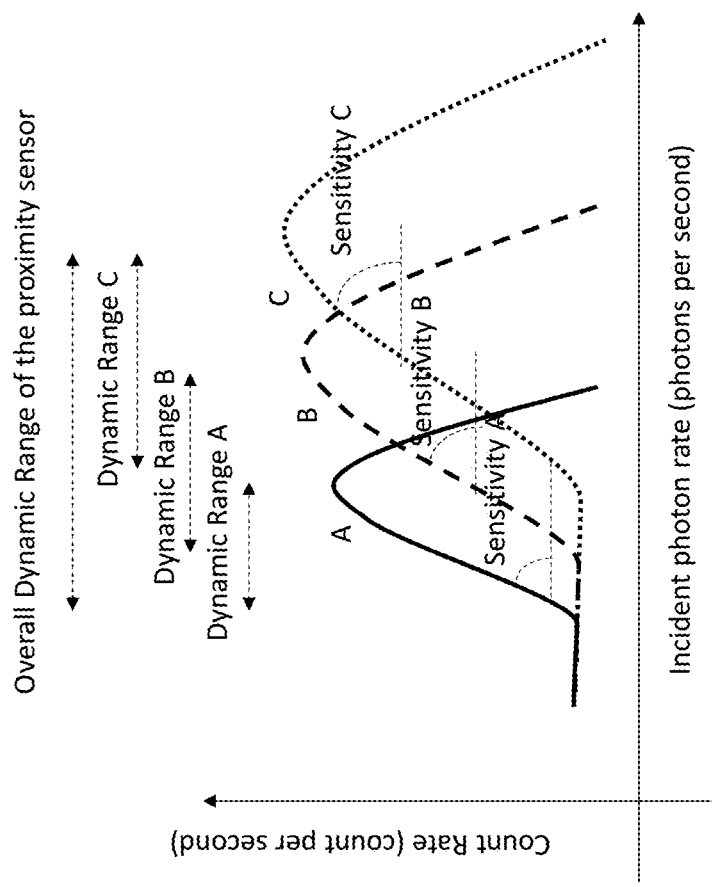
FIG. 20 shows a graph illustrating the variation of a count rate of the avalanche diodes of FIG. 18 in response to the variation of an incident photon rate.

The sensitivity of the avalanche diodes 2 of the type A is higher than the sensitivity of the avalanche diodes 2 of the type B and the sensitivity of the avalanche diodes 2 of the type B is higher than the sensitivity of the avalanche diodes 2 of the type C (as shown on FIG. 20).

The dynamic range of the of the avalanche diodes 2 of the type A is shifted to the left (i.e., to lower incident photon rate) with respect to the dynamic range of the avalanche diodes 2 of the type B and the dynamic range of the of the avalanche diodes 2 of the type B is shifted to the left (i.e., to lower incident photon rate) with respect to the dynamic range of the avalanche diodes 2 of the type C (as shown on FIG. 20). In this way, the overall dynamic range of the optical sensor may be increased whilst increasing the sensitivity of the avalanche diodes 2 of the type B and C.

It will be understood that the same avalanche diode 2 may operate as an avalanche diodes 2 of the type A, B or C depending how it is electrically adjusted.

In some embodiments, the optical sensor may switch between (i) a first mode of operation wherein all the avalanche diodes 2 operate as avalanche diodes 2 of the type A and (ii) a second mode of operation wherein some of the avalanche diodes 2 operate as avalanche diodes 2 of the type A, other avalanche diodes operate as avalanche diodes 2 of the type B and other avalanche diodes are of the type C.

In some embodiments, the optical sensor may switch between (i) a first mode of operation wherein all the avalanche diodes 2 operate as avalanche diodes 2 of the type A, (ii) a second mode of operation wherein some of the avalanche diodes 2 operate as avalanche diodes 2 of the type A and all other avalanche diodes operate as avalanche diodes 2 of the type B and (iii) a third mode of operation where some of the avalanche diodes 2 operate as avalanche diodes 2 of the type A, other avalanche diodes operate as avalanche diodes 2 of the type B and other avalanche diodes operate as avalanche diodes 2 alternatively of the type C.

In some embodiments, VOFFSETA, VOFFSETB and VOFFSETC may all be fixed over a shot cycle of the photoemitter of the optical sensor.

Figure 21:
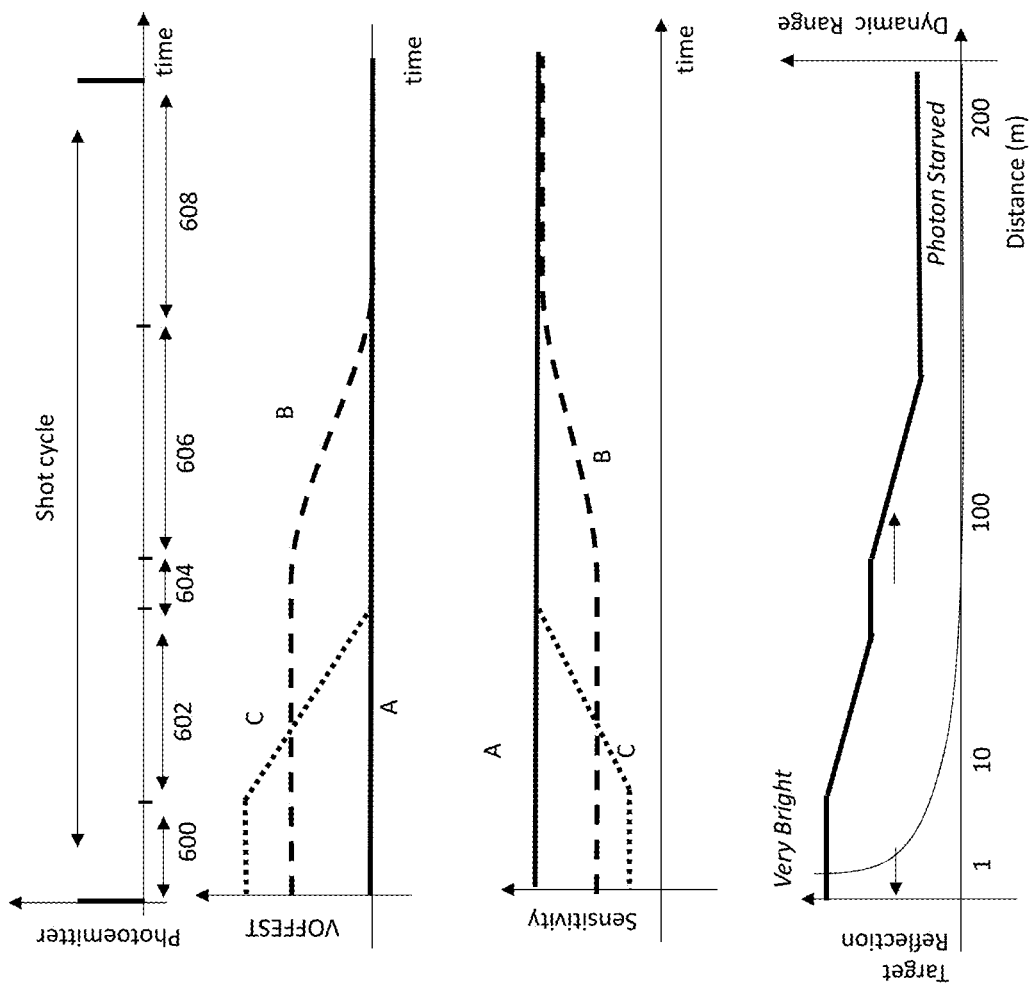
FIG. 21 shows various graphs illustrating the variation of characteristics of the avalanche diodes of FIG. 18 over a shot cycle of a photoemitter.

In some embodiments, VOFFSETA may be fixed over a shot cycle of the photoemitter of the optical sensor and VOFFSETB and VOFFSETC may be varied over the shot cycle of the photoemitter of the optical sensor (as shown on FIG. 21).

For example, during a first portion 600 of the shot cycle VOFFSETB and VOFFSETC are fixed. During a second portion 602 of the shot cycle VOFFSETC decreases and VOFFSETB is fixed. For example, VOFFSETC decreases linearly until being equal to VOFFESTA. During a third portion 604 of the shot cycle VOFFSETB and VOFFSETC are fixed. During a fourth portion 606 of the shot cycle VOFFSETB decreases and VOFFSETC is fixed. For example, VOFFSETB decreases linearly until being equal to VOFFESTA. During a fifth portion 608 of the shot cycle VOFFSETB and VOFFSETC are fixed.

In this way, the optical sensor may operate with an even wider range of incident photon rates than with the arrangement of FIGS. 14 to 17. That is, the optical sensor may detect objects within an even wider range of distances and under a wider range of level of ambient lights than with the arrangement of FIGS. 14 to 17.

Alternatively, the optical sensor may operate with a similar range of incident photon rates than with the arrangement of FIGS. 14 to 17 but more efficiently (i.e., the dynamic ranges of the avalanche diodes of the type A, B and C are more "continuous" and there are less "gaps" in the overall dynamic range of the optical sensor).

Figure 22:
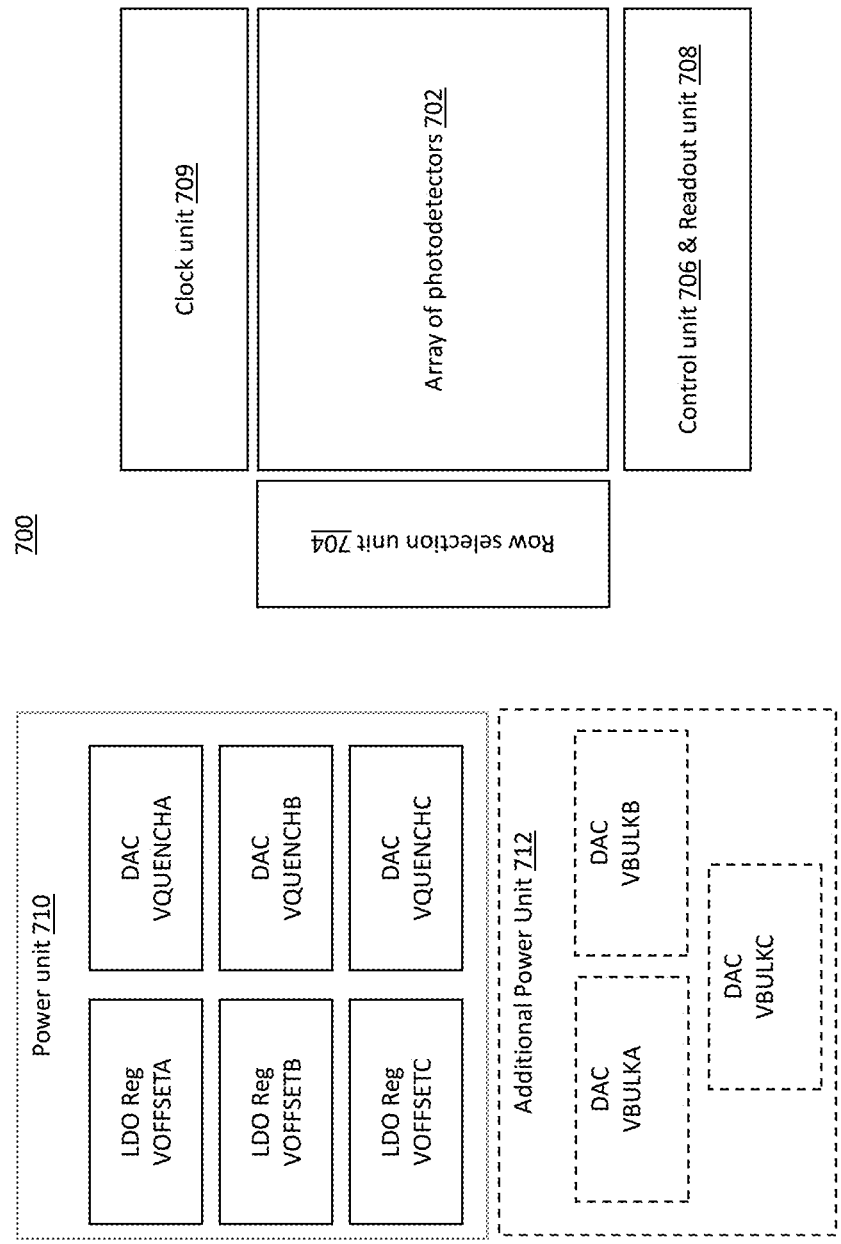
FIG. 22 shows an example of an optical sensor according to an embodiment.

FIG. 22 shows an optical sensor 700 suitable to implement the above disclosure. The optical sensor 700 comprises an array of photodetectors 702. The array of photodetectors may comprise an array of avalanche diodes 2.

The optical sensor 700 comprises a row selection unit 704 for selecting a row within the array of photodetectors 702.

The optical sensor 700 comprises a control unit 706 for activating and deactivating the photodetectors of the selected row within the array of photodetectors 702.

The optical sensor 700 comprises a readout unit 708 for reading out the photodetectors of the selected row within the array of photodetectors 702.

The optical sensor 700 comprises a clock unit 709 for generating a clock and synchronizing the operation of the row selection unit 704, the control unit 706 and the readout unit 708.

The optical sensor 700 comprises a power unit 710 for adjusting VOFFSETA, VOFFSETB, VOFFSETC and VQUENCHA, VQUENCHB, VQUENCHC. For example, the power unit comprises low dropout (LDO) regulators for adjusting VOFFSETA, VOFFSETB, VOFFSETC and VQUENCHA. The power unit comprises digital to analog converter (DAC) for adjusting VQUENCHA, VQUENCHB, VQUENCHC.

The optical sensor comprises an additional power unit 712 when applicable for adjusting VBULKA, VBULKB, and VBULKC. For example, the additional power unit comprises digital to analog converter (DAC) for adjusting for adjusting VOFFSETA, VOFFSETB, VOFFSETC and VQUENCHA.

As discussed above, the switches 38, 80 and 338 of the active pull down modules (see FIGS. 10, 11, 12 and 13) operate as controlled resistances. The higher VQUENCH+VOFFSET, the lower the resistances 38, 80 and 338 and the shorter the dead time of the avalanche diode 2. The lower VQUENCH+VOFFSET, the higher the resistances 38, 80 and 338 and the longer the dead time of the avalanche diode 2.

In practice when VQUENCH+VOFFSET is fixed the resistances 38, 80 or 338 vary over time, for example due to the temperature variation. The higher the temperature the lower the resistances 38, 80 and 338. As a result, the dead time of the avalanche diode 2 may vary over time and the operation of the optical sensor may be affected.

Furthermore the resistances differ over the semiconductor die surface because of process variations. As such the resistance at a 'fast' process corner may differ from the resistance at a 'slow' process corner.

The present disclosure proposes to adjust VQUENCH+ VOFFSET (as opposed to keeping it fixed) so that the resistances 38, 80 and 338 remain fixed irrespective of possible temperature and process variation. In this way, the dead time of the avalanche diode 2 is better controlled and the operation of the optical sensor may be improved. It will however be understood that the following concept may be applied to any controlled resistance and not only to the switches 38, 80 and 338.

Figure 23:
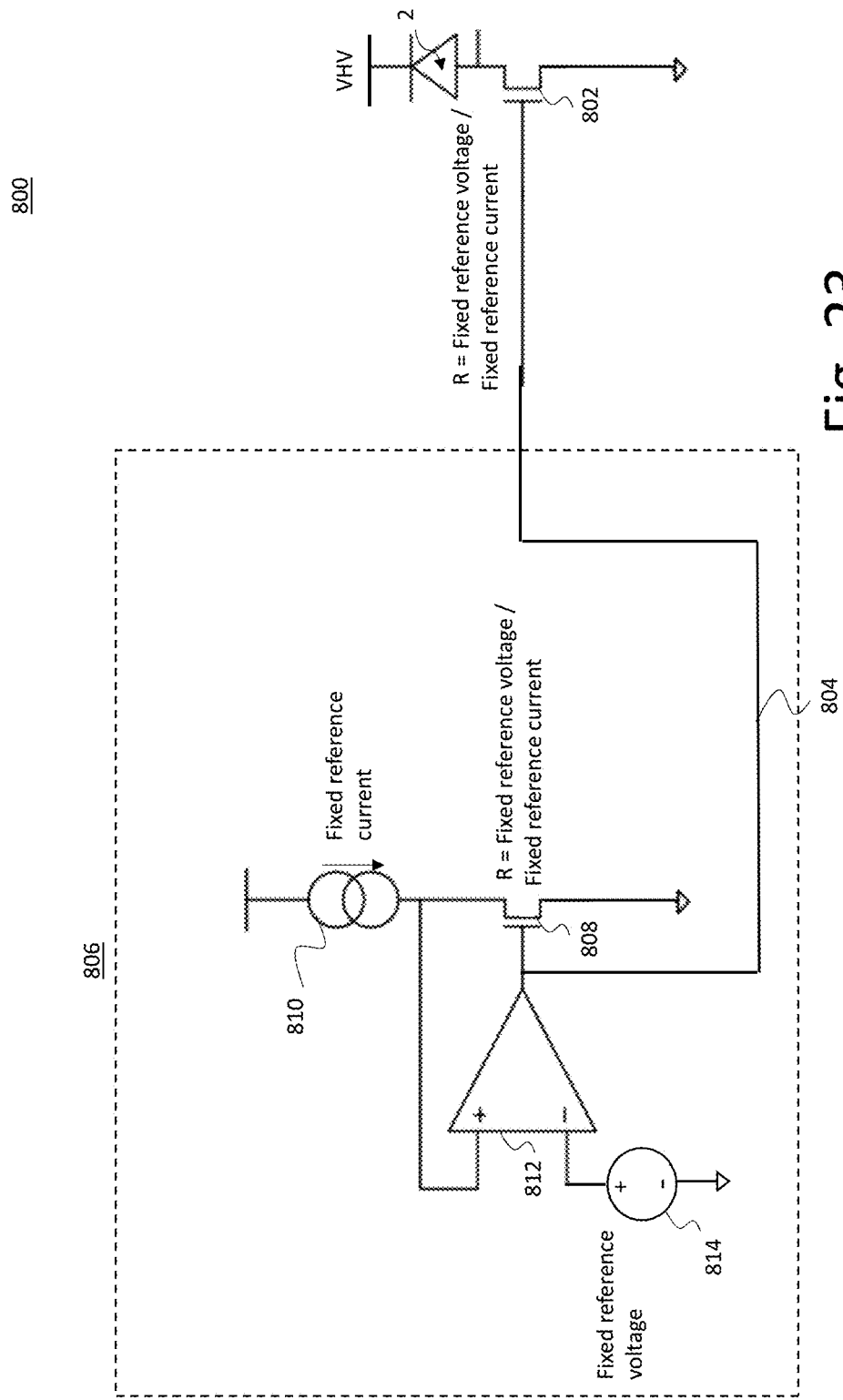
FIGS. 23 and 24 show circuits for controlling the avalanche diode of FIG. 1 using an operational amplifier.
Figure 24:
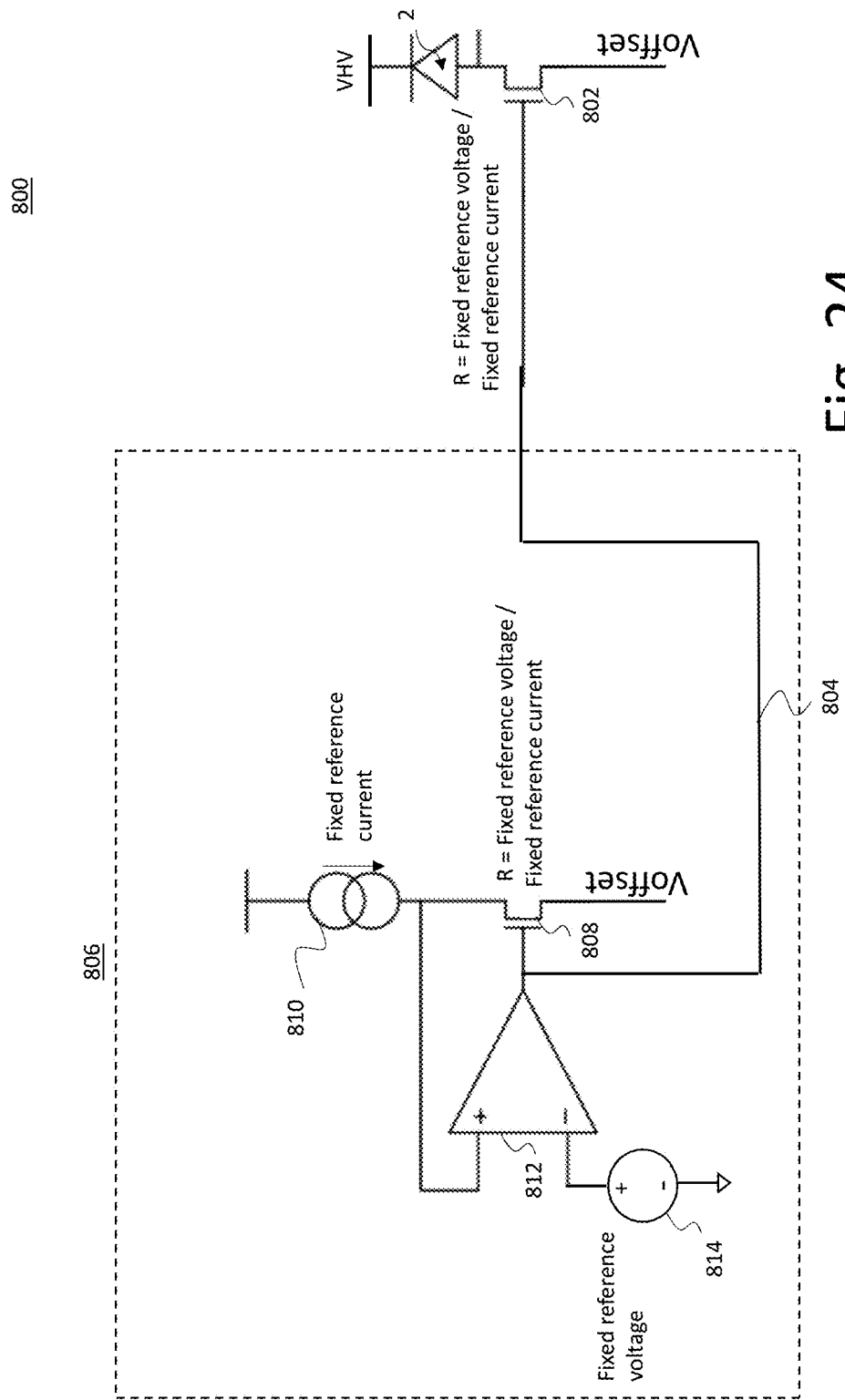

FIGS. 23 and 24 show an optical sensor 800 comprising the avalanche diode 2 and a switch 802 (e.g., switch 38, 80, 338) configured to quench the avalanche diode 2 upon absorption of a photon by the avalanche diode 2. The switch 802 may be part of a pull down module.

The switch 802 operates as a resistance controlled by a controlled signal 804 (e.g., VQUENCH or VQUENCH+ VOFFSET). The higher the control signal 804, the lower the resistance 802 and the shorter the dead time of the avalanche diode 2. The lower the control signal 804, the higher the resistance 802 and the longer the dead time of the avalanche diode 2.

The optical sensor 800 comprises a control unit 806 configured to adjust the control signal 804 so that the resistance 802 remains fixed over time despite temperature variations.

The control unit 806 comprises a switch 808 modeling the switch 802. For example, the switch 808 is identical or substantially identical to the switch 802. The switch 808 also operates as a resistance controlled by the controlled signal 804.

The control unit 806 comprises a current source 810 supplying a fixed reference current to the switch 808.

The control unit 806 comprises an operational amplifier 812 configured to compare a voltage across the switch 808 (e.g., Voltage between the drain and the source) with a fixed reference voltage supplied by a voltage source 814. The operational amplifier 812 is configured to adjust a control signal 804 so that the voltage across the switch 808 always matches the fixed reference voltage. In this way, the control signal 804 ensures that the resistance 802 and the resistance 808 both remain equal to a fixed value R which is determined by the fixed voltage reference and the fixed reference current.

$R$=Fixed reference voltage/Fixed reference current

It will be understood that R may be set to a predetermined value by adjusting the fixed reference voltage and/or the fixed reference current.

In an embodiment, the switch 802 and the switch 808 are NMOS transistors. The switch 802 comprises a drain, a source and a gate. The drain of the switch 802 is connected to the anode of the avalanche diode 2. The source of the switch 802 is connected to a low voltage supply (e.g., GROUND or VOFFSET). The gate of the switch is provided the control signal 804 (e.g., VQUENCH or VQUENCH+ VOFFSET).

The switch 808 comprises a drain, a source and a gate. The drain of the switch 808 is connected to the fixed reference current source 810. The source of the switch 808 is connected to a low voltage supply (e.g., GROUND or VOFFSET).

The operational amplifier 812 comprises a positive input, a negative input and an output. The positive input is connected to the drain of the switch 808. The negative input of the operational amplifier 812 is connected to the fixed reference voltage source 814. The output of the operational amplifier 812 is connected to the gate of the switch 808 and to the gate of the switch 802.

Figure 25:
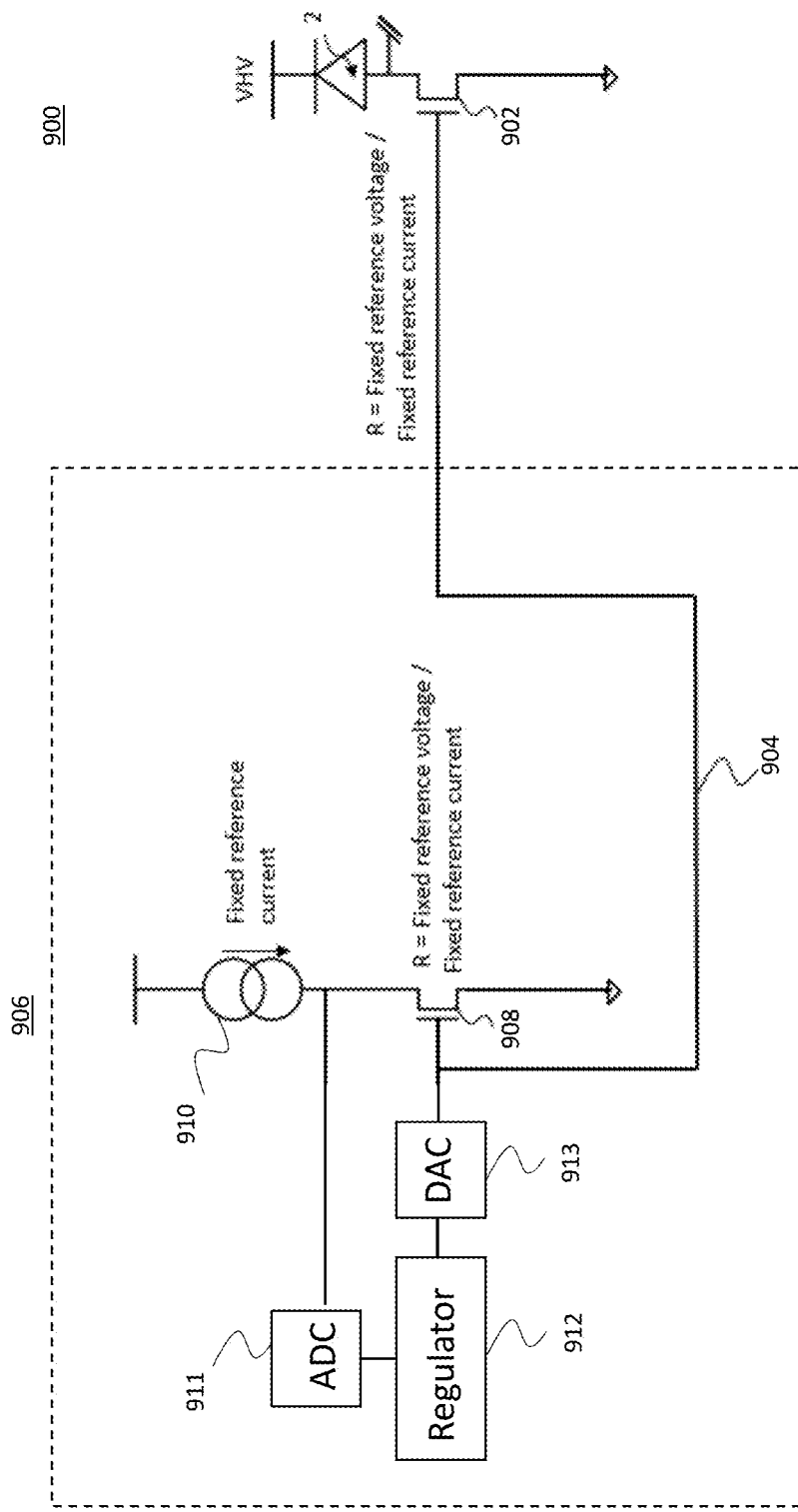
FIGS. 25 and 26 show circuits for controlling the avalanche diode of FIG. 1 using voltage regulator.
Figure 26:
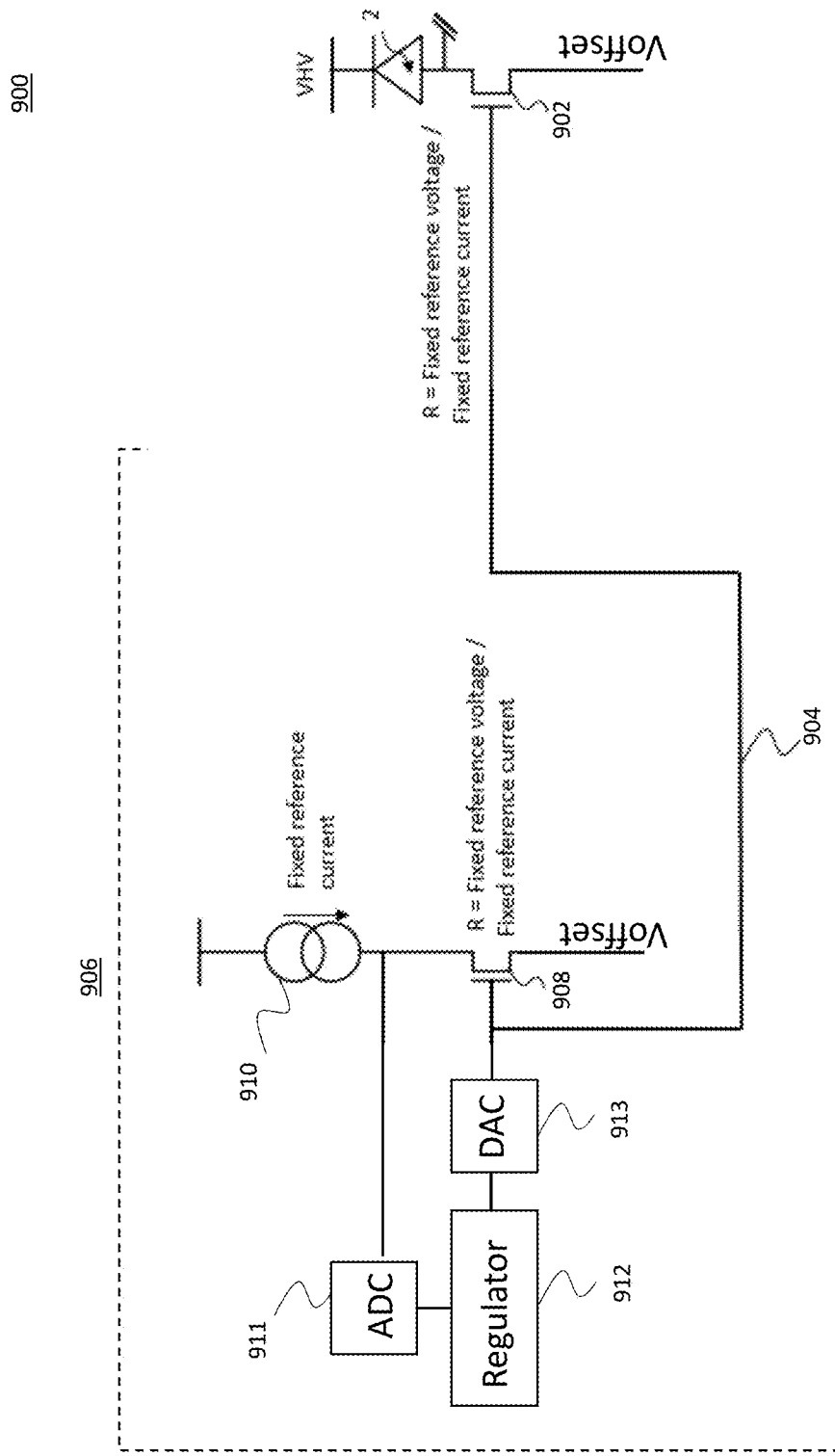

FIGS. 25 and 26 show an optical sensor 900 comprising the avalanche diode 2 and a switch 902 (e.g., switch 38, 80, 338) configured to quench the avalanche diode 2 upon absorption of a photon by the avalanche diode 2. The switch 902 is part of a pull down module.

The switch 902 operates as a resistance controlled by a controlled signal 904 (e.g., VQUENCH or VQUENCH+ VOFFSET). The higher the control signal 904, the lower the resistance 902 and the shorter the dead time of the avalanche diode 2. The lower control signal 904, the higher the resistance 902 and the longer the dead time of the avalanche diode 2.

The optical sensor 900 comprises a control unit 906 configured to adjust the control signal 904 so that the resistance 902 remains fixed over time despite temperature variations and over the sensor die despite process variations.

The control unit 906 comprises a switch 908 modeling the switch 902. For example, the switch 908 is identical or substantially identical to the switch 902. The switch 908 also operates as a resistance controlled by the controlled signal 904.

The control unit 906 comprises a current source 910 supplying a fixed reference current to the switch 908.

The control unit 906 comprises an analog to digital converter 911 configured to convert a voltage across the switch 908 (e.g., Voltage between drain and source) into a digital voltage across the switch 908.

The control unit 906 comprises a voltage regulator 912 configured to compare the voltage across the switch 908 with a fixed reference voltage. The voltage regulator 912 is configured to adjust a control signal so that the voltage across the switch 908 always matches the fixed reference voltage.

The control unit 906 comprises a digital to analog converter 913 configured to convert the control signal into a control signal 904.

The analog control signal 804 is adjusted so that the resistance 902 and the resistance 908 both remain equal to a fixed value R which is determined by the fixed voltage reference and the fixed reference current (for example over time/or the die).

$R$=Fixed reference voltage/Fixed reference current

It will be understood that R may be set to a predetermined value by adjusting the fixed reference voltage and/or the fixed reference current.

In an embodiment, the switch 902 and the switch 908 are NMOS transistors. The switch 902 comprises a drain, a source and a gate. The drain of the switch 902 is connected to the anode of the avalanche diode 2. The source of the switch 902 is connected to a low voltage supply (e.g., GROUND or VOFFSET). The gate of the switch is provided the control signal 804 (e.g., VQUENCH or VQUENCH+ VOFFSET).

The switch 908 comprises a drain, a source and a gate. The drain of the switch 908 is connected to the fixed reference current source 910. The source of the switch 908 is connected to a low voltage supply (e.g., GROUND or VOFFSET).

The analog to digital converter is connected to the drain of the switch 902.

The digital to analog converter is connected to the gate of the switch 902 and to the gate of the switch 908.

Figure 27:
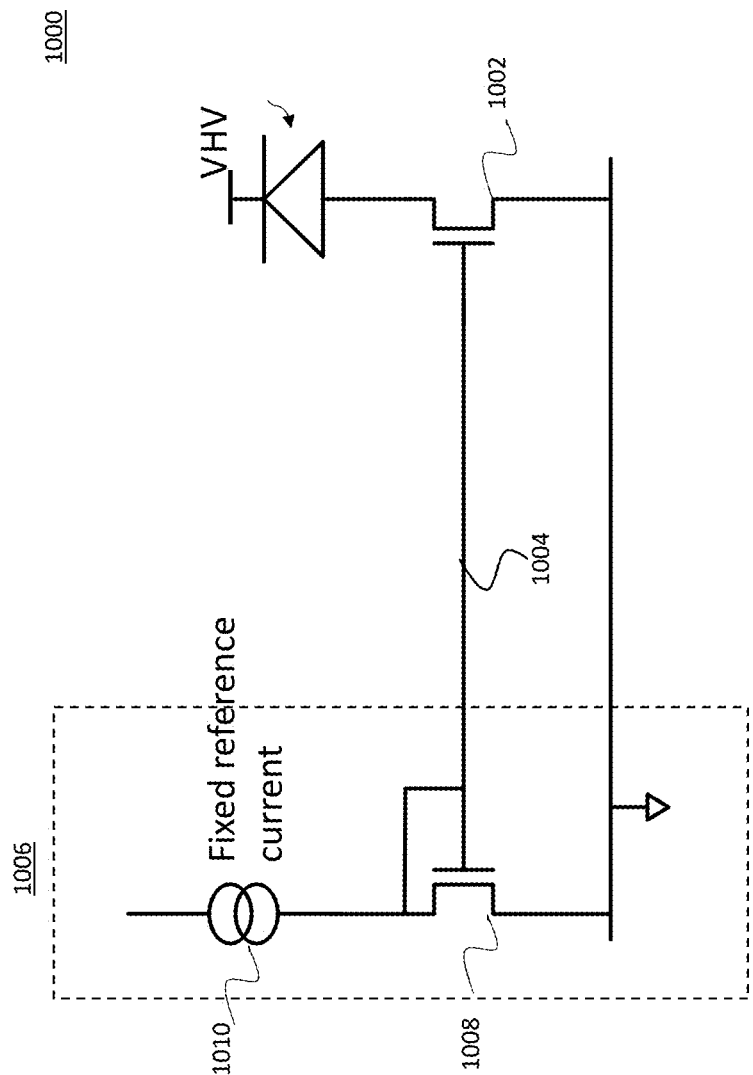
FIGS. 27 and 28 show circuits for controlling the avalanche diode of FIG. 1 using neither an operational amplifier nor voltage regulator.

FIG. 27 shows an optical sensor moo comprising the avalanche diode 2 and a switch 1002 (e.g., switch 38, 80, 338) configured to quench the avalanche diode 2 upon absorption of a photon by the avalanche diode 2. The switch 1002 is part of a pull down module.

The switch 1002 operates as a resistance controlled by a controlled signal 1004 (e.g., VQUENCH or VQUENCH+ VOFFSET). The higher the control signal 1004, the lower the resistance 1002 and the shorter the dead time of the avalanche diode 2. The lower control signal 1004, the higher the resistance 1002 and the longer the dead time of the avalanche diode 2.

The optical sensor moo comprises a control unit 1006 configured to adjust the control signal 1004 so that the resistance 1002 remains fixed over time despite temperature variations and over the sensor die despite process variations.

The control unit 1006 comprises a switch 1008 modeling the switch 1002. For example, the switch 1008 is identical or substantially identical to the switch 1002. The switch 1008 also operates as a resistance controlled by the controlled signal 1004.

The control unit 1006 comprises a current source 1010 supplying a fixed reference current to the switch 1008.

In the example, the switch 1002 and the switch 1008 are NMOS transistors. The switch 1002 comprises a drain, a source and a gate. The drain of the switch 1002 is connected to the anode of the avalanche diode 2. The source of the switch 1002 is connected to a low voltage supply (e.g., GROUND or VOFFSET). The gate of the switch 1002 is provided the control signal 1004 (e.g., VQUENCH or VQUENCH+VOFFSET).

The switch 1008 comprises a drain, a source and a gate. The drain of the switch 1008 is connected to the fixed reference current source 1010. The source of the switch 1008 is connected to a low voltage supply (e.g., GROUND or VOFFSET). The gate of the switch 1008 is shorted to the drain of the switch 1008 and is connected to the gate of the switch 1002.

Figure 28:
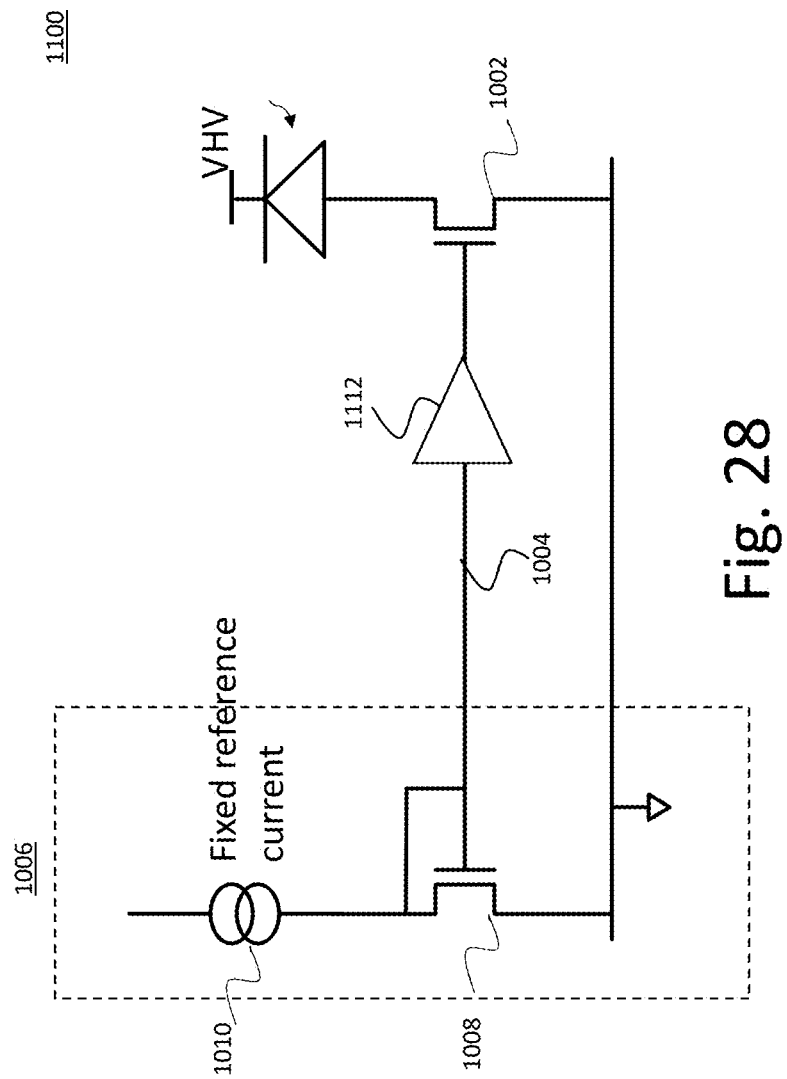

FIG. 28 shows an optical sensor 1100 similar to the optical sensor moo except that the gate of the switch 1008 is further connected to the gate of the switch 1002 by a buffer 1112.

Figure 29:
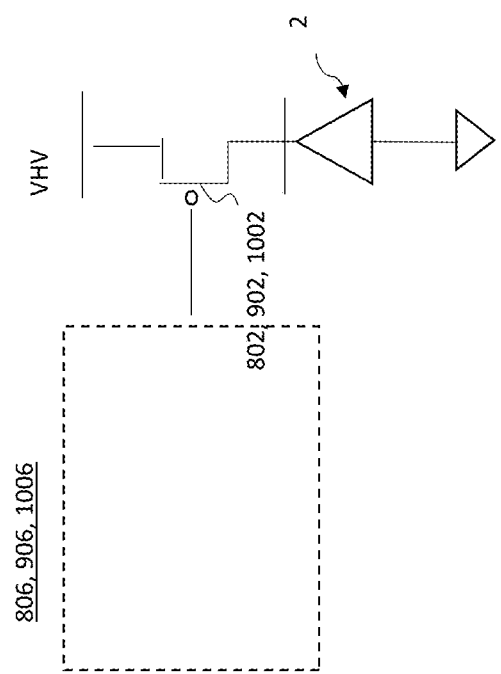
FIG. 29 show PMOS variants of the circuits of FIGS. 23 to 28.

FIG. 29 shows an optical sensor 1200 similar to the optical sensors 800, 900, 1000 or 1100 except that the switches 802, 902 and 1002 and the switches 808, 908 and 1008 and 1108 are PMOS transistors rather NMOS transistors.

It will be understood that the optical sensors described above may be integrated in an apparatus such as a depth map camera, a mobile phone, a tablet computer, a desktop computer, a laptop computer, a video game console, a video door, a smart watch, automotive vehicles, etc.

Various embodiments with different variations have been described here above. It should be noted that those skilled in the art may combine various elements of these various embodiments and variations.

Such alterations, modifications, and improvements are intended to be part of this disclosure, and are intended to be within the scope of the claims. Accordingly, the foregoing description is by way of example only and is not intended to be limiting. The invention is limited only as defined in the claims and the equivalents thereto.

What is claimed is:

1. An optical sensor, comprising:
   a first photodetector configured to be reverse biased at a voltage exceeding a breakdown voltage by a first excess bias voltage, the first excess bias voltage being fixed over a shot cycle of a photoemitter;
   a second photodetector configured to be reverse biased at a voltage exceeding a breakdown voltage by a second excess bias voltage different from the first excess bias voltage, the second excess bias voltage being lower than the first excess bias voltage, the second excess bias voltage being increased during a subsequent portion of the shot cycle of the photoemitter;
   a third photodetector configured to be reverse biased at a voltage exceeding a breakdown voltage by a third excess bias voltage, the third excess bias voltage being lower than the second excess bias voltage, the third excess bias voltage being increased during a portion of the shot cycle of the photoemitter; and
   a control unit configured to reverse bias the first photodetector, the second photodetector, and the third photodetector.

2. The optical sensor of claim 1, wherein the control unit is configured to adjust a voltage of an anode of the first photodetector.

3. The optical sensor of claim 1, wherein the control unit comprises:
   a first switch having a current path coupled between the first photodetector and a ground node, the first switch configured to be operated as a controlled resistance;
   a second switch having a current path coupled between a control input of the first switch and the ground node, the second switch configured to be in a conductive state when the control unit is disabled;
   a third switch having a current path coupled between the control input of the first switch and a voltage supply, the third switch configured to be in a conductive state when the control unit is enabled; and
   a fourth switch having a current path coupled between the first photodetector and a second voltage supply.

4. An optical sensor, comprising:
   a first photodetector configured to be reverse biased at a voltage exceeding a breakdown voltage by a first excess bias voltage;
   a second photodetector configured to be reverse biased at a voltage exceeding a breakdown voltage by a second excess bias voltage different from the first excess bias voltage; and
   a control unit configured to adjust the first excess bias voltage and to vary the second excess bias voltage during different portions of a shot cycle of a photoemitter.

5. The optical sensor of claim 4, wherein the control unit comprises:
   a first control unit configured to adjust the first excess bias voltage; and a second control unit configured to vary the second excess bias voltage during the different portions of the shot cycle of the photoemitter.

6. The optical sensor of claim 4, wherein the optical sensor can be operated in:
a first mode of operation wherein all photodetectors operate as first photodetectors; and
a second mode of operation wherein some photodetectors operate as first photodetectors and some photodetectors operate as second photodetectors.

7. The optical sensor of claim 4, further comprising a third photodetector configured to be reverse biased at a voltage exceeding a breakdown voltage by a third excess bias voltage different from the first excess bias voltage and the second excess bias voltage, wherein the control unit is configured to adjust the third excess bias voltage.

8. The optical sensor of claim 7, wherein the optical sensor can be operated in:
a first mode of operation wherein all photodetectors operate as first photodetectors;
a second mode of operation wherein some photodetectors operate as first photodetectors and all other photodetectors operate as second photodetectors; and
a third mode of operation wherein some photodetectors operate as first photodetectors, some photodetectors operate as second photodetectors, and some photodetectors operate as third photodetectors.

9. The optical sensor of claim 7, wherein the second excess bias voltage is lower than the first excess bias voltage or the third excess bias voltage is lower than the second excess bias voltage.

10. The optical sensor of claim 9, wherein the first excess bias voltage is fixed over the shot cycle of the photoemitter.

11. The optical sensor of claim 9, wherein the third excess bias voltage is varied over the shot cycle of the photoemitter.

12. The optical sensor of claim 11, wherein the second excess bias voltage or the third excess bias voltage are increased over the shot cycle of the photoemitter.

13. The optical sensor of claim 11, wherein the second excess bias voltage and the third excess bias voltage are increased during different portions of the shot cycle of the photoemitter.

14. The optical sensor of claim 13, wherein the third excess bias voltage is increased during a portion of the shot cycle of the photoemitter and the second excess bias voltage is increased during a subsequent portion of the shot cycle of the photoemitter.

15. The optical sensor of claim 13, wherein the second excess bias voltage and the third excess bias voltage are increased until being equal to the first excess bias voltage.

16. A method of operating an optical sensor comprising:
reverse biasing a first photodetector above a breakdown voltage by a first excess bias voltage;
reverse biasing a second photodetector above a breakdown voltage by a second excess bias voltage;
adjusting the reverse bias of the first photodetector; and
varying the reverse bias of the second photodetector during different portions of a shot cycle of a photoemitter.

17. The method of claim 16, wherein the optical sensor comprises the first photodetector, the second photodetector and a third photodetector, the method further comprising:
reverse biasing the second photodetector at a voltage exceeding a breakdown voltage by a second excess bias voltage different than the first excess bias voltage;
reverse biasing the third photodetector at a voltage exceeding a breakdown voltage by a third excess bias voltage different than the first excess bias voltage and the second excess bias voltage;
adjusting the reverse bias of the third photodetector.

18. The method of claim 17, wherein the second excess bias voltage is lower than the first excess bias voltage and the third excess bias voltage is lower than the second excess bias voltage.

19. The method of claim 18, wherein the first excess bias voltage is fixed over the shot cycle of the photoemitter.

20. The method of claim 19, wherein the third excess bias voltage is varied over the shot cycle of the photoemitter.

21. The method of claim 20, wherein the second excess bias voltage and the third excess bias voltage are increased over the shot cycle of the photoemitter.

22. The method of claim 20, wherein the second excess bias voltage and the third excess bias voltage are increased during different portions of the shot cycle of the photoemitter.

23. The method of claim 22, wherein the third excess bias voltage is increased during a portion of the shot cycle of the photoemitter and the second excess bias voltage is increased during a subsequent portion of the shot cycle of the photoemitter.

24. The method of claim 22, wherein the second excess bias voltage and the third excess bias voltage are increased until being equal to the first excess bias voltage.

25. A method of operating an optical sensor comprising:
reverse biasing a first photodetector of the optical sensor above a breakdown voltage by an excess bias voltage, the excess bias voltage being fixed over a shot cycle of a photoemitter;
reverse biasing a second photodetector of the optical sensor at a voltage exceeding a breakdown voltage by a second excess bias voltage lower than the excess bias voltage; and
reverse biasing a third photodetector of the optical sensor at a voltage exceeding a breakdown voltage by a third excess bias voltage lower than the second excess bias voltage, the third excess bias voltage being increased during a portion of the shot cycle of the photoemitter and the second excess bias voltage being increased during a subsequent portion of the shot cycle of the photoemitter.

* * * * *